(12) United States Patent
Wiesböck et al.

(10) Patent No.: US 10,436,834 B2
(45) Date of Patent: Oct. 8, 2019

(54) INTEGRATED TESTING AND HANDLING MECHANISM

(71) Applicant: Rasco GmbH, Kolbermoor (DE)

(72) Inventors: Andreas Wiesböck, Stepanskirchen (DE); Serge Künzli, La-Chaux-de-Fonds (CH); Max Schaule, Mindelheim (DE); Guy Ramel, Orges (CH)

(73) Assignee: RASCO GMBH, Kolbermoor (DE)

( * ) Notice: Subject to any disclaimer, the term of this patent is extended or adjusted under 35 U.S.C. 154(b) by 576 days.

(21) Appl. No.: 15/035,802

(22) PCT Filed: Nov. 10, 2014

(86) PCT No.: PCT/US2014/064787
§ 371 (c)(1),
(2) Date: May 11, 2016

(87) PCT Pub. No.: WO2015/070135
PCT Pub. Date: May 14, 2015

(65) Prior Publication Data
US 2016/0306008 A1    Oct. 20, 2016

Related U.S. Application Data

(60) Provisional application No. 61/902,575, filed on Nov. 11, 2013.

(51) Int. Cl.
*G01R 31/28* (2006.01)
(52) U.S. Cl.
CPC ..... *G01R 31/2893* (2013.01); *G01R 31/2868* (2013.01)
(58) Field of Classification Search
CPC ...... G01R 1/04; G01R 1/0408; G01R 1/0433; G01R 1/0491; G01R 1/06744;
(Continued)

(56) References Cited

U.S. PATENT DOCUMENTS

| 3,384,236 A | 5/1968 | Best et al. |
| 4,926,118 A | 5/1990 | O'Connor et al. |
| (Continued) | | |

FOREIGN PATENT DOCUMENTS

| DE | 19750949 A1 | 6/1998 |
| DE | 19854697 A1 | 9/1999 |
| (Continued) | | |

OTHER PUBLICATIONS

Office Action dated Feb. 13, 2018 in related Taiwanese Appl. No. 103138939 with English-language translation (14 pgs.).

(Continued)

*Primary Examiner* — Tung X Nguyen
(74) *Attorney, Agent, or Firm* — Foley & Lardner LLP

(57) ABSTRACT

An integrated testing and handler mechanism includes an input/output module including: an input section, an output section, a turret that includes a plurality of pickup heads, and a shuttle configured to move the carrier from the component loading location to a test module transfer location; and a test module including: a test head comprising an array of a plurality of test sockets, a plunger configured to plunge the components held by the carrier into the test sockets when the carrier is located on the plunger, and a rotary table that includes a plurality of grippers that rotate around the rotary table, the rotary table being configured to (i) transfer a carrier between the test module transfer location and an input/output module transfer location, (ii) rotate the carrier between the input/output module transfer location and a plunger transfer location, and (iii) transfer the carrier between the plunger transfer location and plunger.

15 Claims, 26 Drawing Sheets

(58) Field of Classification Search
CPC ............... G01R 1/073; G01R 1/07342; G01R 31/2601; G01R 31/2886; G01R 31/2887
See application file for complete search history.

(56) References Cited

U.S. PATENT DOCUMENTS

| | | | |
|---|---|---|---|
| 5,227,717 | A | 7/1993 | Tsurishima et al. |
| 5,267,467 | A * | 12/1993 | Caron |
| 7,355,428 | B2 | 4/2008 | Kabbani et al. |
| 9,429,617 | B2 | 8/2016 | Tseng et al. |
| 2002/0041181 | A1 | 4/2002 | Kim et al. |
| 2002/0109518 | A1 | 8/2002 | Saito et al. |
| 2003/0117161 | A1 | 6/2003 | Burns |
| 2004/0164723 | A1 | 8/2004 | Bae et al. |
| 2005/0099173 | A1 | 5/2005 | Siade et al. |
| 2005/0162151 | A1 | 7/2005 | Tsui et al. |
| 2007/0018673 | A1 | 1/2007 | Hsieh |
| 2010/0097075 | A1 | 4/2010 | Sze et al. |
| 2010/0097083 | A1 | 4/2010 | Sze et al. |
| 2010/0109699 | A1 * | 5/2010 | Anderson et al. |
| 2010/0305747 | A1 * | 12/2010 | Agorio et al. |
| 2012/0146678 | A1 | 6/2012 | Lanowitz et al. |
| 2013/0207679 | A1 | 8/2013 | Cheng et al. |

FOREIGN PATENT DOCUMENTS

| | | |
|---|---|---|
| EP | 2148211 A1 | 1/2010 |
| TW | M408039 U1 | 7/2011 |
| TW | 201303321 A1 | 1/2013 |
| TW | 201307867 A1 | 2/2013 |
| TW | M459406 U1 | 8/2013 |

OTHER PUBLICATIONS

International Search Report/Written Opinion dated May 12, 2015 in PCT/US2014/064787 (24 pgs.).

* cited by examiner

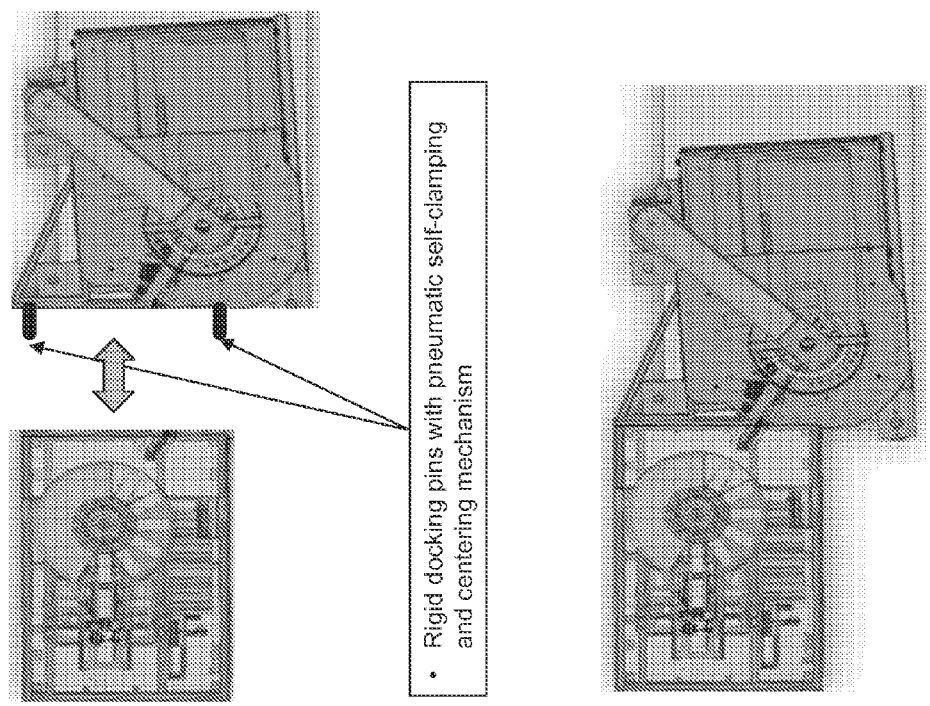

INTEGRATED TESTING AND HANDLING MECHANISM

CROSS-REFERENCE TO RELATED APPLICATIONS

The present application claims the benefit of U.S. Provisional Patent Application No. 61/902,575, filed Nov. 11, 2013, which is herein incorporated by reference in its entirety.

FIELD OF THE INVENTION

The present disclosure relates to an integrated testing and handler mechanism, and more particularly to an integrated testing and handling mechanism allowing for parallel testing of multiple components.

BACKGROUND OF THE INVENTION

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Handler apparatuses are used to transport electronic components and devices, such as integrated circuit (IC) devices. Such apparatuses are commonly used to transport such components to and from a testing apparatus that assesses a component's performance. In this regard, a handler is used to insert the component into a test socket of a testing apparatus, such as an electrical tester. Such electrical testers are often used to determine various performance-related characteristics.

Many currently available test techniques perform testing before the wafers on which the devices are arranged have been diced and sorted. However, dicing and sorting can affect reliability, and also performing testing after such processes is costly and takes additional time. As die thickness decreases, the risk for damage caused by dicing and handling increases. Thus, it would be advantageous to provide an improved testing and handler mechanism allowing for parallel testing in order to lower cost, improve reliability, and potentially avoid the need for human intervention in transporting components from a test station to a final packaging station.

SUMMARY OF THE INVENTION

According to one embodiment, an integrated testing and handler mechanism comprises a test module including: a plurality of carriers, each of the carriers being configured to hold a plurality of components, a contactor array comprising an array of a plurality of test sockets, and a plunger configured to plunge the components held by the carrier into the test sockets when the carrier is located on the plunger; and an input/output module including: an input section, an output section, an input shuttle assembly, an output shuttle assembly, a turret configured to: (i) move components to be tested from the input section to the input shuttle assembly, and (ii) move tested components from the output shuttle assembly to the output section, a first pick-and-place device configured to move a row of components to be tested from the input shuttle assembly to at least one of the carriers, and a second pick-and place device configured to move a row of tested components from at least one of the carriers to the output shuttle assembly.

In one aspect, the first shuttle is an alternating dual shuttle comprising two independently driven shuttles each configured to hold a row of the components to be tested.

In one aspect, the integrated testing and handler mechanism further comprises a vision alignment system.

In one aspect, the integrated testing and handler mechanism further comprises a controller configured to control movement of the plunger, wherein the plunger is configured to move in an x-direction, a y-direction, and a O-direction to align the carrier located on the plunger relative to the contactor array.

In one aspect, the vision alignment system further comprises at least one camera that measures a position of at least one fiducial marking on a carrier and at least one fiducial marking on the socket arrangement.

In one aspect, output shuttle assembly is a curved air track.

In one aspect, the curved air track is configured such that tested components can be blown back into the turret.

In one aspect, the output shuttle assembly is an alternating dual shuttle assembly.

In one aspect, wherein the input/output module is configured such that the input shuttle assembly is loaded while the output shuttle assembly is unloaded.

In one aspect, at least one of the carriers is a single device carrier that clamps the components therein so as to maintain positions of the components.

In one aspect, the integrated testing and handler mechanism further comprises a gripping mechanism that urges the at least one carrier onto the plunger.

In one aspect, the input section comprises a wafer table, and the output section comprises a tray.

In one aspect, the test module further comprises a micro-electrical-mechanical ("MEMS") stimulus module.

In one aspect, the integrated testing and handler mechanism further comprises an active thermal control system configured to heat the components while the components are on the plunger In one aspect, the integrated testing and handler mechanism further comprises a conductive soaking module comprising a plate configured to heat or cool components located on a carrier when the carrier is in the conductive soaking module.

In another embodiment, an integrated testing and handler mechanism comprises a test module including: a contactor array comprising an array of a plurality of test sockets, a shuttle assembly comprising at least two shuttles, and a rotatable plunger comprising a plurality of sides, each side including a plurality of plunger heads, the rotatable plunger being configured to (i) receive components in the plurality of plunger heads on one of the sides, (ii) rotate the components such that the components face the contactor array, (iii) plunge the components into the test sockets for testing, (iv) rotate the tested components such that the tested component face a shuttle of the shuttle assembly, and (v) deposit the tested components onto the shuttle; and an input/output module including: an input section, an output section, a wafer table, a first pick-and-place device configured to retrieve components to be tested from the wafer table in a vertical direction, rotate the retrieved components, and plunge the retrieved components in a horizontal direction into the plunger heads on one of the sides of the rotatable plunger, a second pick-and-place device configured to move tested components from the shuttle of the shuttle assembly to the output section.

In one aspect, the integrated testing and handler mechanism further comprises an active thermal control system configured to heat the components while the components are on the rotatable plunger.

In one aspect, the integrated testing and handler mechanism further comprises a visional alignment system that includes a camera that measures positions of the components on the rotatable plunger.

In one aspect, the integrated testing and handler mechanism further comprises a controller configured to forward position information derived from the camera to an individually actuatable alignment frame of the contactor array.

In one aspect, the integrated testing and handler mechanism further comprises a vision inspection system.

In another embodiment, an integrated testing and handler mechanism comprises an input/output module including: an input section, an output section, a turret that includes a plurality of pickup heads, the pickup heads being configured to (i) move components from the input section to a carrier located in a component loading location, and (ii) move components from the carrier located in the component loading location to the output section, and a shuttle configured to move the carrier from the component loading location to a test module transfer location; and a test module including: a test head comprising an array of a plurality of test sockets, a plunger configured to plunge the components held by the carrier into the test sockets when the carrier is located on the plunger, and a rotary table that includes a plurality of grippers that rotate around the rotary table, the rotary table being configured to (i) transfer a carrier between the test module transfer location and an input/output module transfer location, (ii) rotate the carrier between the input/output module transfer location and a plunger transfer location, and (iii) transfer the carrier between the plunger transfer location and the plunger.

In one aspect, the test module includes a test module vision alignment system configured to align components on the carrier to the test sockets of the contactor array.

In one aspect, the integrated testing and handler mechanism further comprises a conductive soaking module comprising a plate configured to heat or cool components in the carrier when the carrier is lowered onto the plate by the gripper.

In one aspect, the input/output module includes an input/output module vision alignment system configured to align components on the carrier.

In one aspect, the input/output vision alignment system includes: a first downward-looking camera configured to view a component to be transferred to the carrier, and a controller configured to determine a translational and angular offset between (i) a contact pattern of the component and (ii) a package outline of the component, based on information received from the first downward-looking camera.

In one aspect, the input/output vision alignment system further includes: an upward-looking camera configured to view the pickup head while the pickup head holds a component, wherein the controller is configured to determine a translational and angular offset between (i) the package outline of the component and (ii) the pickup head, based on information received from the upward-looking camera.

In one aspect, the input/output vision alignment system further includes: an alignment table configured to hold a component by vacuum, wherein the controller is configured to cause the alignment table to move such that the component is aligned to the pickup head, based on the determined translational and angular offset between (i) the package outline of the component and (ii) the pickup head.

In one aspect, the input/output vision alignment system further includes: a second downward-looking camera configured to view the carrier, wherein the controller is configured to determine a translational and angular offset between the carrier and the pickup head.

In one aspect, the carrier includes a plurality of fiducials by which the controller is configured to determine the translational and angular offset between the carrier and the pickup head.

In one aspect, the controller is configured to determine a thermal elongation of the carrier based on locations of the fiducials.

In one aspect, the controller is configured to control linear encoders of the shuttle to move the carrier such that the carrier is aligned to the pickup head, based on the determined translational and angular offset between the carrier and the pickup head.

In one aspect, the controller is configured to control linear encoders of the shuttle to move the carrier such that the carrier is aligned to the pickup head, based on the determined translational and angular offset between the carrier and the pickup head, and based on the thermal elongation of the carrier.

In one aspect, the carrier is a vacuum carrier.

In one aspect, the carrier is a kitless carrier.

In one aspect, the carrier comprises: a main body, a front vacuum interface, and a bottom vacuum interface.

In one aspect, the carrier comprises: a main body including: a lower body portion, an upper body, a central vacuum supply chamber located between the lower body portion and the upper body portion, and a component placement layer disposed over the upper body portion, the component placement layer having a planar upper surface on which components are placeable, wherein a plurality of vacuum cavities extend through the upper body portion from the central vacuum supply chamber to the component placement layer; and at least one vacuum interface.

In one aspect, the component placement layer is made of a porous conductive material.

In one aspect, the component placement layer includes a plurality of micro-holes that extend through the component placement layer from each vacuum supply cavity to an upper surface of the component placement layer.

In one aspect, the integrated testing and handler mechanism is configured to maintain a vacuum supply to the carrier while the carrier is at the turret of the input/output module for component loading and unloading, during carrier transport on the shuttle, while the carrier is transferred between the shuttle and the rotary table, while the carrier is gripped by the gripper of the rotary table, while the carrier is moved between the rotary table and the plunger, and while the carrier is on the plunger during testing.

In one aspect, the integrated testing and handler mechanism is configured to maintain a vacuum supply to the carrier by alternately supplying vacuum via the front vacuum interface and the bottom vacuum interface.

In another embodiment, a carrier for carrying components comprises: a main body including: a lower body portion, an upper body, a central vacuum supply chamber located between the lower body portion and the upper body portion, and a component placement layer disposed over the upper body portion, the component placement layer having a planar upper surface on which components are placeable, wherein a plurality of vacuum cavities extend through the upper body portion from the central vacuum supply chamber to the component placement layer; and at least one vacuum interface.

In one aspect, the component placement layer is made of a porous conductive material.

In one aspect, the component placement layer includes a plurality of micro-holes that extend through the component placement layer from each vacuum supply cavity to an upper surface of the component placement layer.

BRIEF DESCRIPTION OF THE DRAWINGS

Embodiments of the invention are described by referring to the attached drawings, in which:

FIG. 26 is a side schematic diagram of an integrated testing and handler mechanism, before docket (top) and after docking (bottom).

DETAILED DESCRIPTION

In the following description, for purposes of explanation and not limitation, details and descriptions are set forth in order to provide a thorough understanding of embodiments of the present invention. However, it will be apparent to those skilled in the art that the present invention may be practiced in other embodiments that depart from these details and descriptions. For example, while the embodiments below are described in reference to a mechanism used to handle and test electronic components, the mechanism may be used in other applications.

First Functional Diagram

Figure 1:
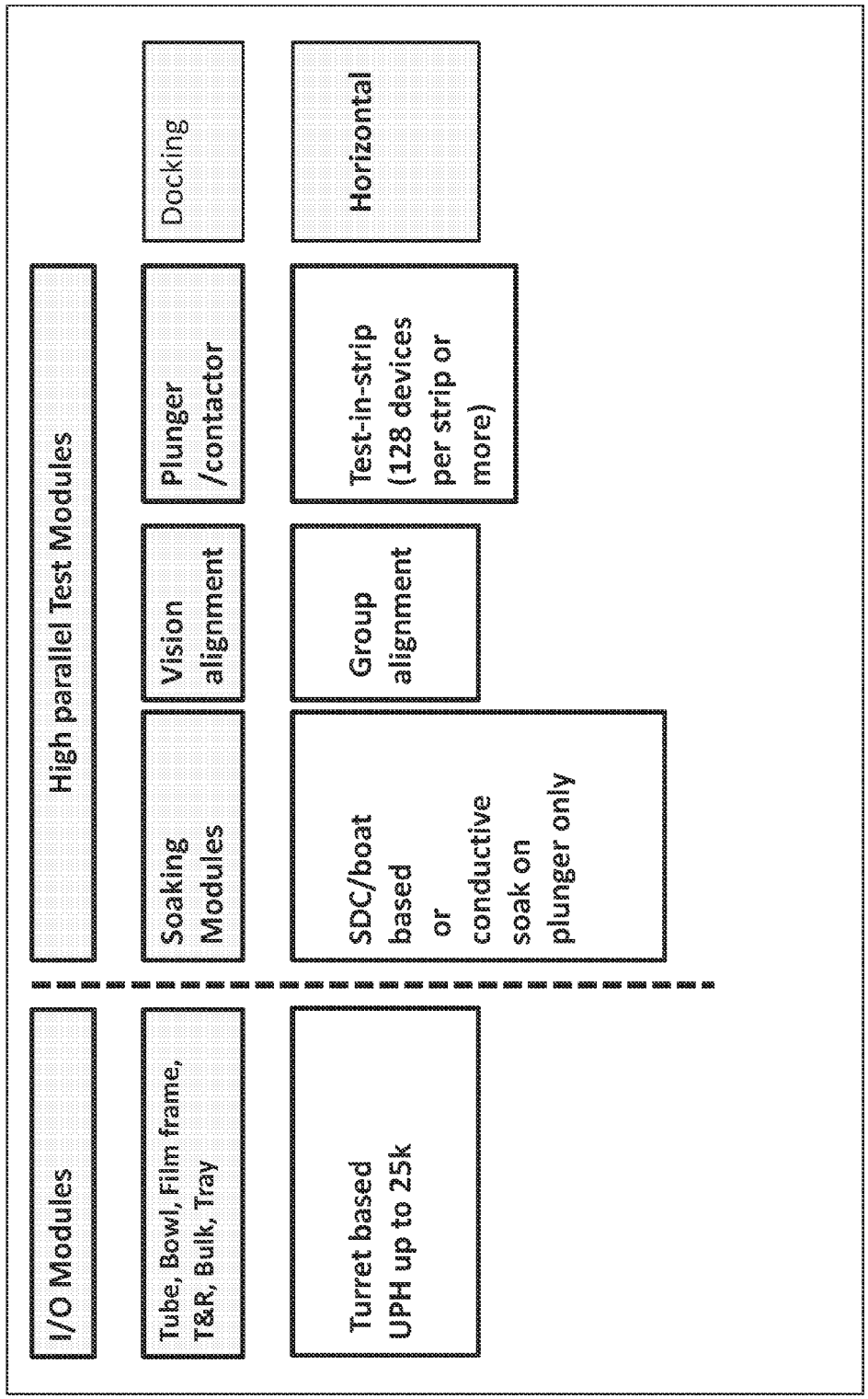
FIG. 1 is a first functional diagram for an integrated testing and handler mechanism.

A first functional diagram for an integrated testing and handler mechanism is shown in FIG. 1. The first and second embodiments described below are configured in accordance with the first functional diagram.

First Embodiment Integrated Turret Loader/Unloader and X-Y-θ Plunger System

Figure 2:
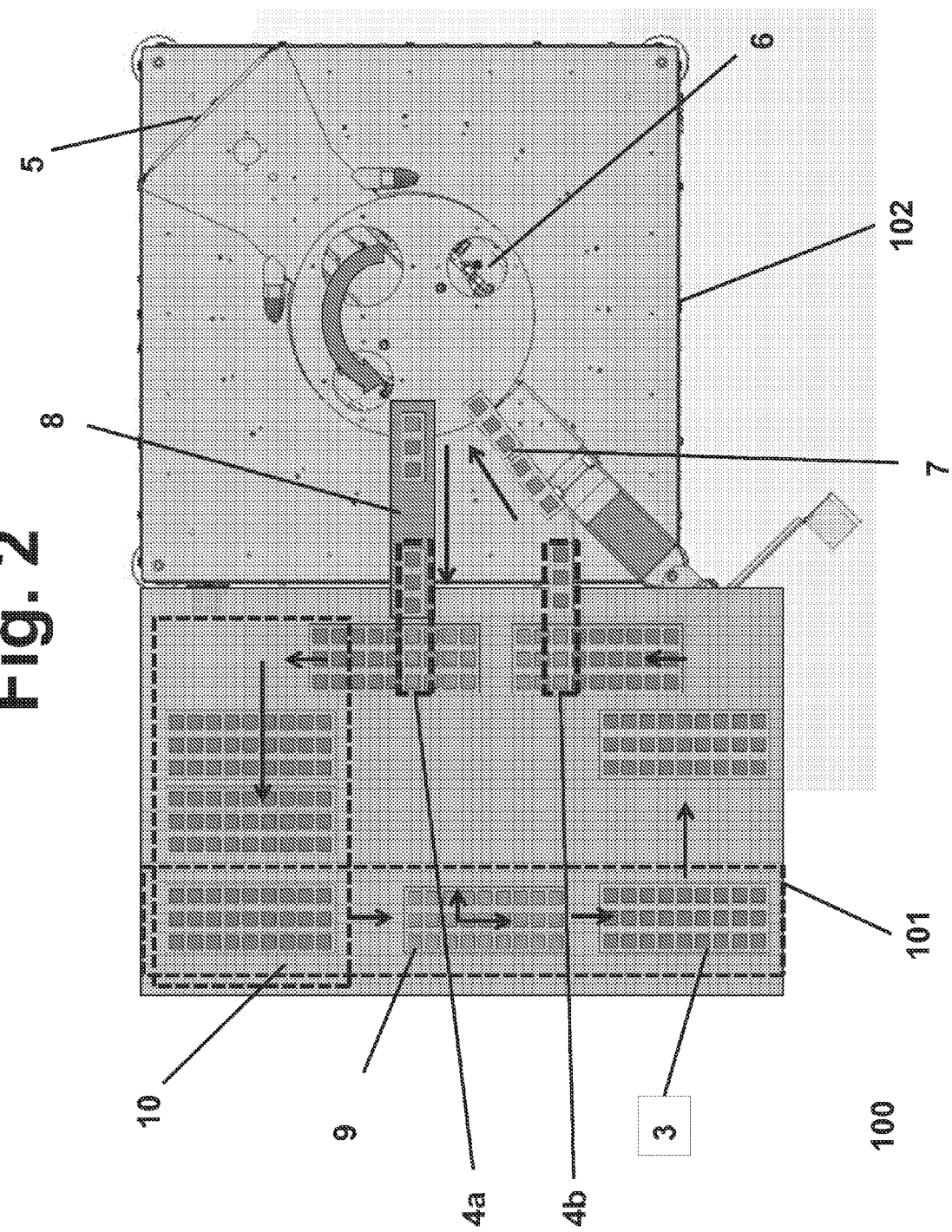
FIG. 2 is a top view schematic diagram of an integrated testing and handler mechanism in accordance with the functional diagram of FIG. 1, according to a first embodiment.

As shown in FIG. 2, an integrated testing and handler mechanism 100 includes a test module 101 and an input/output module 102. Components are tested in the test module 101 components while other components are being handled by the input/output module 102. The test module 101 and input/output module 102 are docked to one another in a horizontal manner. Components suitable for handling by the input/output module 102 and the test module 101 include ball grid arrays ("BGAs"), quad-flat no-leads (QFN) packages, silicon-on-insulator ("SO") devices, and various dies, among others.

Test Module

The integrated testing and handler mechanism 100 includes a test module 101. Referring to FIG. 2, the test module 101 includes a plurality of carriers 3. The carriers 3 can be boat carriers, in which components are placed into cavities within the carrier, or a single-device carrier ("SDC"), in which components are places into cavities and then clamped inside the cavity using springs. By mechanically clamping components in the cavity, SDC type carriers maintain the position of components therein despite severe mechanical shock or vibration. SDC type carriers are described, for example, in European Patent Application No. 13 154 816, the contents of which are incorporated by reference in their entirety. The carrier 3 is configured such that a pitch of the carrier matches a pitch of a plunger, which is described below. A single carrier 3 holds, for example, between 8 and 128 components, or more than 128 components.

The test module 101 includes a contactor area 9 at which components are tested. A contactor array (i.e., test head) having a plurality of test sockets is located in the contactor area 9. After the carrier is moved to the contactor area 9, a plunger moves the carrier upward so that the components are inserted into the test sockets. The plunger and contactor array are configured such that the simultaneous testing of all components in the carrier may be performed, or testing of only a subset of the components in the carrier may be performed. The plunger and contactor array may be configured similarly to those in the SO3000 test-in-strip handler, produced by Rasco GmbH.

The test module 101 includes a vision alignment system. The vision alignment system permits visual alignment of groups of components. The array of cavities in the carrier can be aligned in the x, y, and θ directions to the array of test sockets of the contactor array. The vision alignment system includes cameras that measure positions of fiducial markers located on the carrier and fiducial markers located on the contactor array. Based on offsets of corresponding fiducial markers, a position controller for the plunger is configured to move the plunger such that the components in the carrier are aligned to the contactor array.

The test module 101 further includes a conductive soaking module located in a conductive soaking area 10. The soaking module is configured to bring components to required test temperatures (for example, temperatures between −60° C. and 160° C.). For cold soaking, the soaking area may be held in a dry atmosphere (e.g., gaseous nitrogen or dry air with a dew point below −70° C.) to prevent condensation of water on the components or carriers.

The soaking module is an SDC/boat based soaking module, or a "soak-on-plunger" module. In an SDC/boat based soaking module, a carrier holding untested components is brought to a test temperature by moving the carrier over a hot or cold plate in the conductive soaking area. The plunger and the contact sockets are also kept at test temperature. In a soak-on-plunger module, which is typically used for small components (3 mm×3 mm), components are moved directly onto a plunger without being soaked on the hot or cold plate, and the plunger itself brings the components to test temperature.

Input/Output Module

The integrated testing and handler mechanism 100 includes an input/output module 102.

The input/output module 2 of the mechanism transports untested components from an input device located in an input section 5 to carriers 3 of the test module 101, and transports tested components from the carriers 3 to an output device located in an output section 6. The input device is a tube type device, a bowl type device, or a detaping device for tape and reel packages. The output device is a tube type device (holding one bin), a bulk type device (holding, for example, eight bins), or a tape and reel device (holding one bin).

The input/output module 102 is turret based. For example, the input/output module 102 may be configured similarly to the NY20 turret handler, or the NX32 turret handler, available from Cohu, Inc. The input/output module 102 preferably has a throughput of at least 25,000 components per hour.

Referring again to FIG. 2, the integrated testing and handler mechanism 100 includes pick-and-place devices 4a, 4b for moving components to be tested to and from the carriers. A first pick-and-place device 4a is a multiple pick-and-place device configured to pick up a row of components (or other subset of components) from an input shuttle apparatus 8 and move the row to a carrier 3. A second pick-and-place device 4b is a multiple pick-and-place device configured to pick up at least one row of tested components (or other subset of tested components) from a carrier 3 and more the row to an output shuttle apparatus 7.

The input shuttle apparatus 8 is an alternating dual shuttle apparatus, which includes two independently driven shuttles, each of the two independently driven shuttles being configured to hold one row components to be moved to the carrier. While one shuttle of the input shuttle apparatus 8 is loaded by the turret cavity-by-cavity, the other shuttle of the input shuttle apparatus 8 is unloaded in a single step by the pick-and-place device 4a. The input shuttle apparatus 8 may allow for pitch adaption.

The output shuttle 7 is a curved air track or an alternating dual shuttle with track rotation. If the output shuttle 7 is configured as an alternating dual shuttle, each shuttle is configured to a rotate around a vertical axis so as to adapt to different component orientations at the loading and unloading positions.

Operation of the Integrated Turret L/U and X-Y-θ Plunger System

The integrated testing and handler mechanism 100 of the first embodiment operates as follows. Components to be tested are loaded from the input section 5 of the turret into the input shuttle apparatus 8. The multiple pick-and-place device 4a transfers one complete row of components into an empty carrier 3. While moving through the conductive soaking area 10, both components and the carrier are brought up to the test temperature. A gripper mechanism or other similar transportation unit (not shown) moves the carrier 3 onto the plunger. The carrier 3 containing the components is moved up by the plunger to a contact a contactor array including a plurality of test sockets to thereby establish an electrical contact between the components and the test sockets. After electrical testing has been performed, the plunger retrieves the carrier 3 from the socket arrangement, and the carrier 3 is unloaded from the plunger by a gripper mechanism or a similar transportation unit (not shown). The boat is unloaded by the multiple pick-and-place device 4b, which transfers one complete row of components into the output shuttle apparatus 7. In the output shuttle apparatus 7, air blows the components back to the turret, which moves tested components to the output section 6.

Second Embodiment Alternative Integrated Turret L/U and X-Y-θ Plunger System

Figure 3:
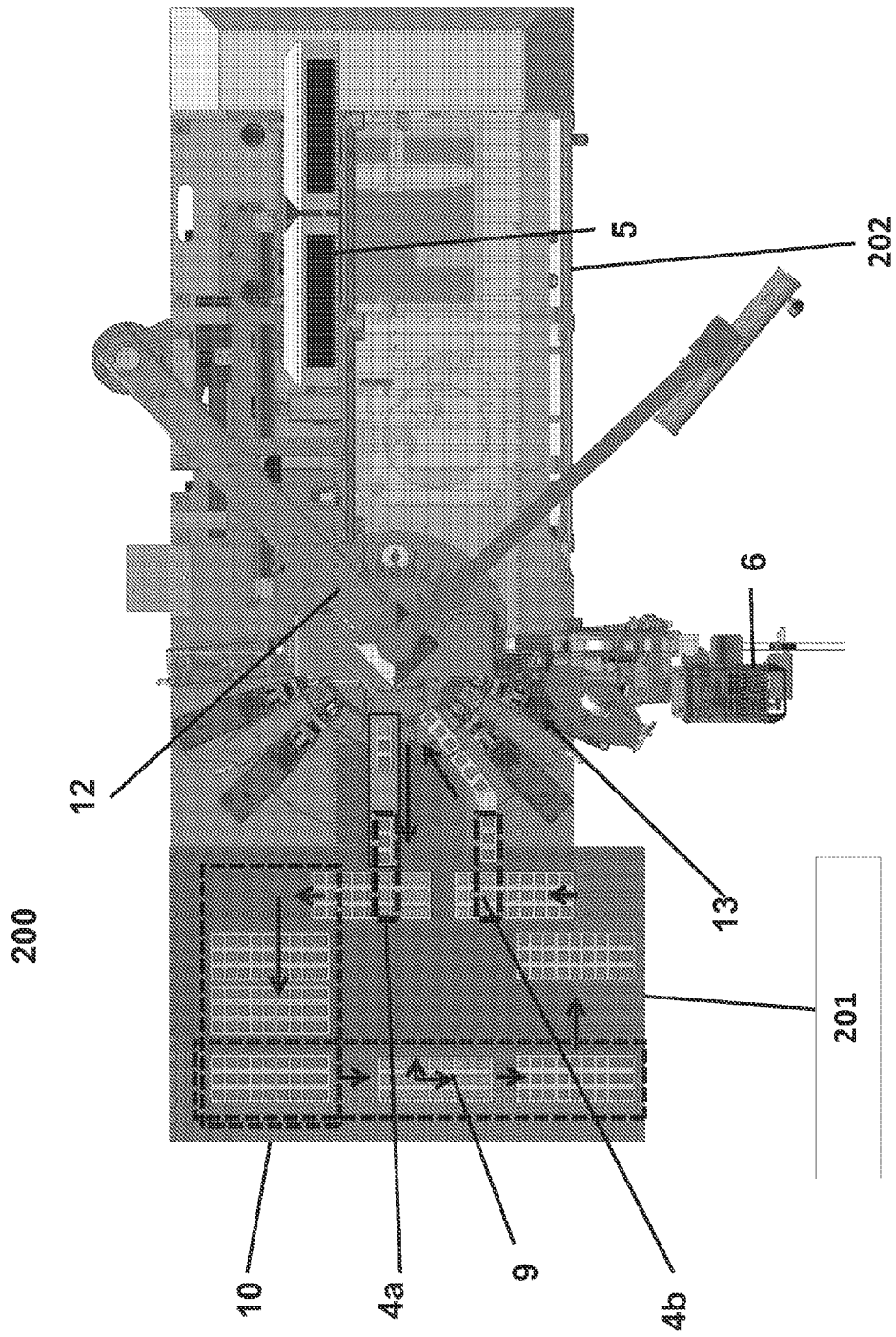
FIG. 3 is a top view schematic diagram of an integrated testing and handler mechanism in accordance with the functional diagram of FIG. 1; according to a second embodiment.

As shown in FIG. 3, an integrated testing and handler mechanism 200 according to a second embodiment includes a test module 201 and an input/output module 202.

The second embodiment is similar in its principles to the first embodiment. The integrated testing and handler mechanism 200 differs from the integrated testing and handler mechanism 100 as described below.

In the second embodiment, the input device may be a film frame device, in which case the input section includes a wafer table configured to handle small devices on a film frame. The input device may alternatively be a tray type device, a tube type device, a bowl type device, or a detaping device. The output device may be a tray type device, a tube type device (holding one bin), a bulk type device (holding, for example, eight bins), or a tape and reel device (holding one bin).

Figure 4:
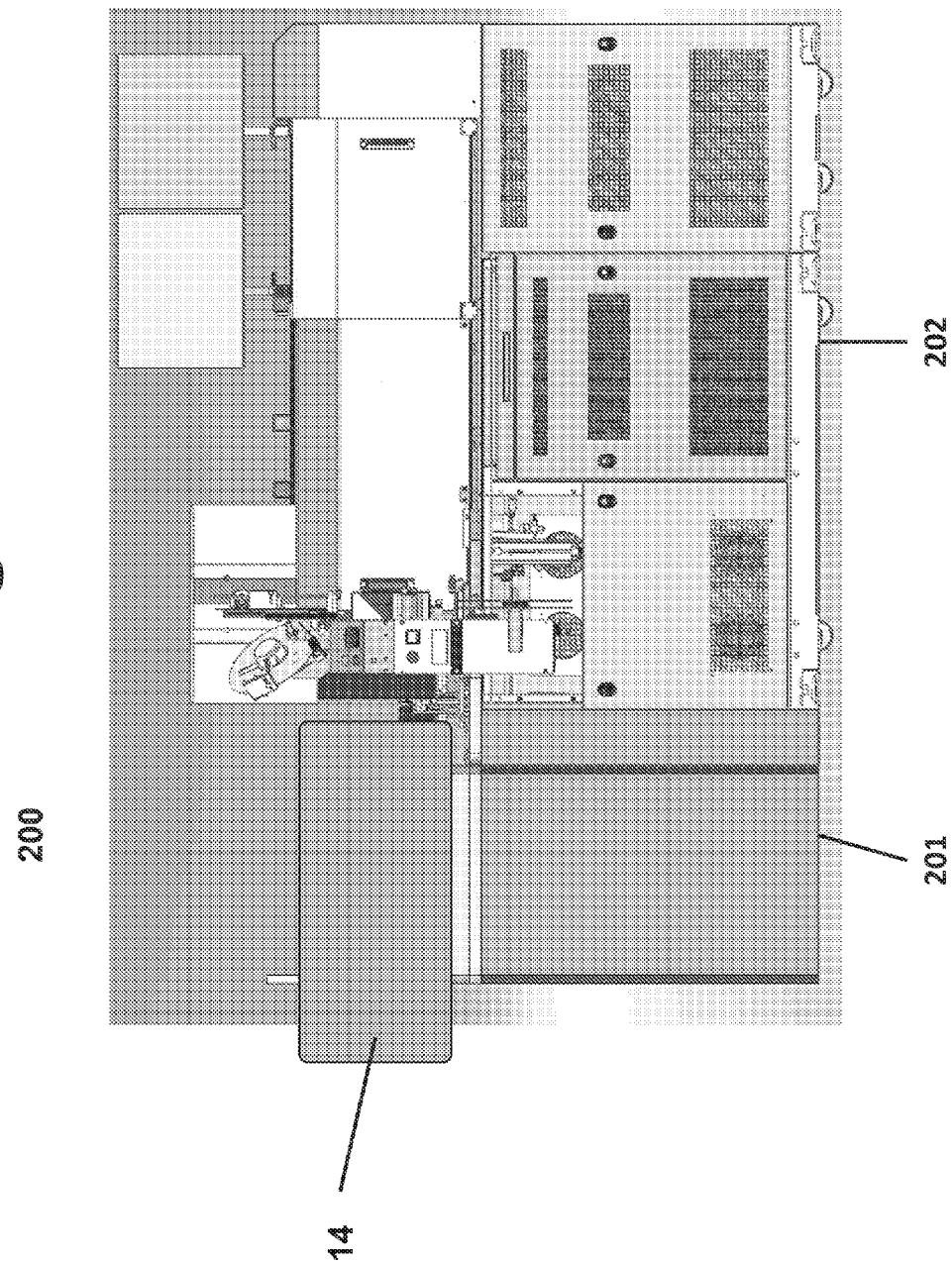
FIG. 4 is a side view schematic diagram of the integrated testing and handler mechanism of FIG. 3.

Turning to FIG. 4, the integrated testing and handler mechanism 200 includes a test head or Micro-Electrical-Mechanical System ("MEMS") stimulus 14 provided with the test module 201. The MEMS stimulus can be a MEMS testing device as described in U.S. Pat. No. 8,336,670, the contents of which are incorporated by reference in their entirety. The test head or MEMS stimulus 14 is configured to be disposed above a lower portion of the input/output module 202. The test head or MEMS stimulus 14 is configured to permit overhead docking.

The MEMS stimulus device 14 includes a socket configured to receive the carrier 3.

The MEMS stimulus device 14 is a pressure-based MEMS stimulus device, an acoustic MEMS stimulus device, a humidity MEMS stimulus device, an inertial MEMS stimulus device, or a magnetic MEMS stimulus device. The pressure-based MEMS stimulus device, acoustic MEMS stimulus device, and humidity MEMS stimulus device may be configured such that the carrier 3 is plunged onto an open pressure chamber, where the carrier 3 acts as a sealing cover. The inertial MEMS stimulus device is configured such that the carrier 3 is plunged onto a mechanism which can be moved and rotated in three axes (x, y, and z). The magnetic MEMS stimulus is configured such that the carrier 3 is plunged onto a unit which includes an electric coil that stimulates a magnetic field in three axes (x, y, and z).

Second Functional Diagram

Figure 5:
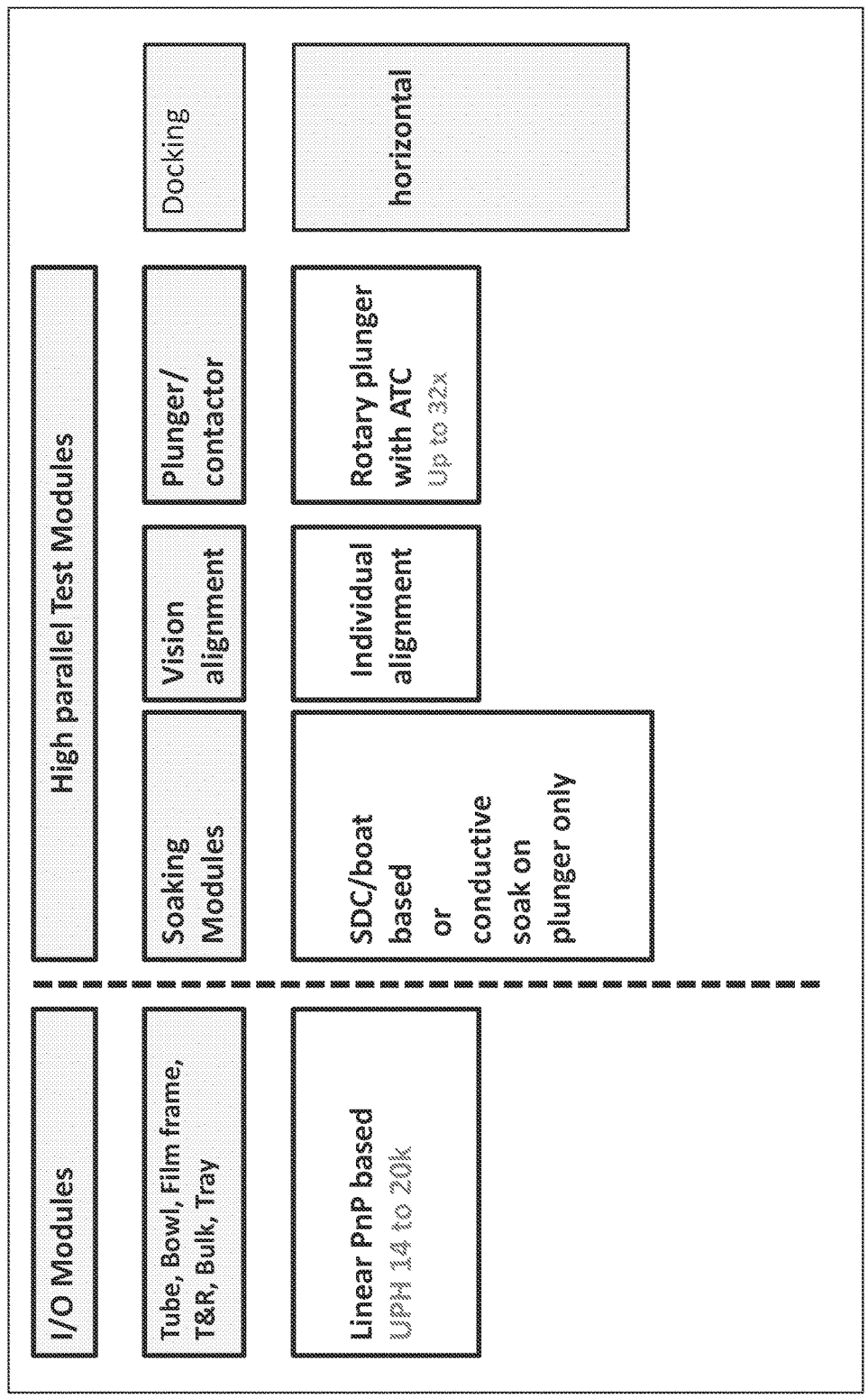
FIG. 5 is a second functional diagram of an integrated testing and handler mechanism.

A second functional diagram for an integrated testing and handler mechanism is shown in FIG. 5. The third embodiment described below is configured in accordance with the second functional diagram.

Third Embodiment Small Part Pick and Place System

Figure 6:
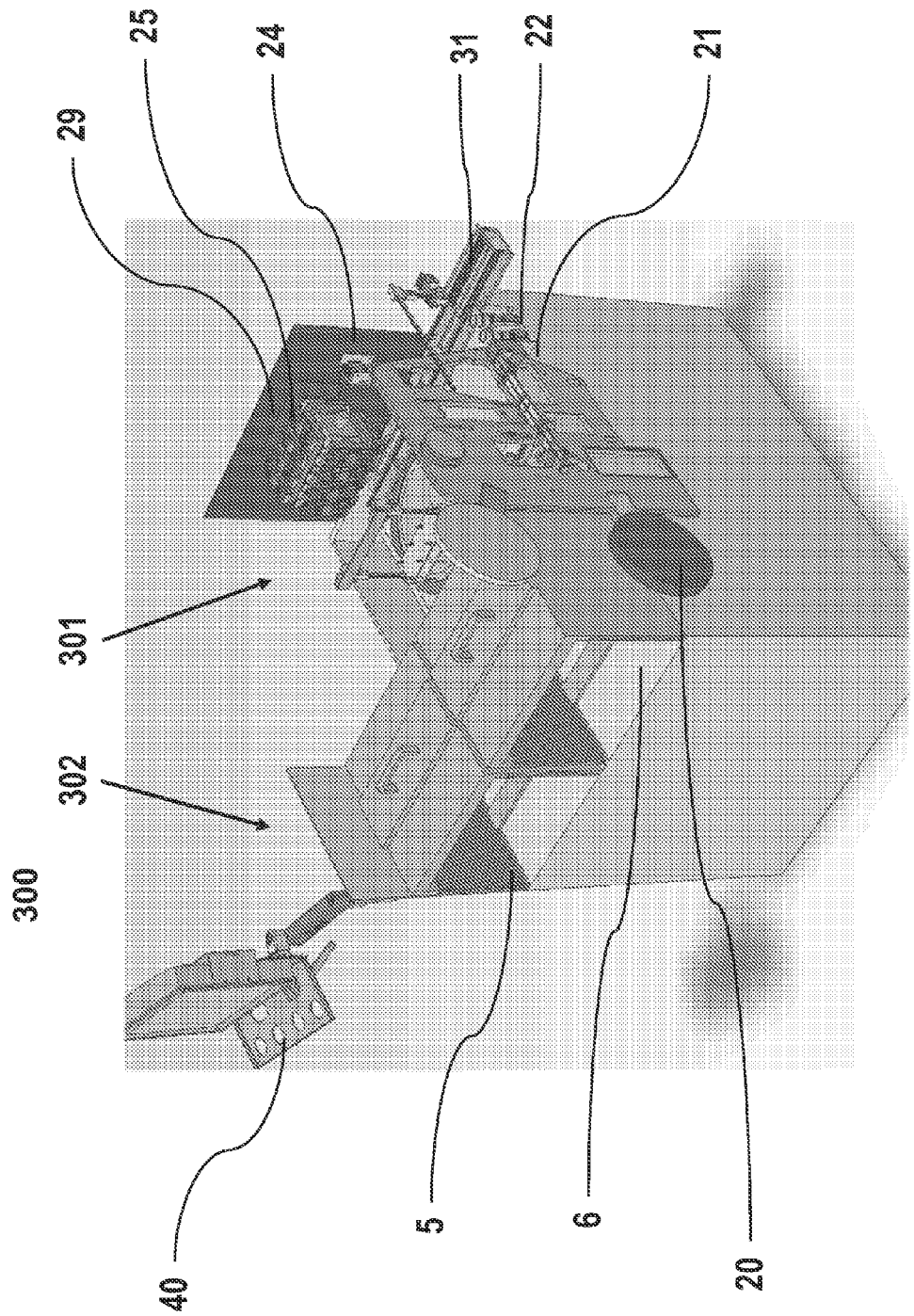
FIG. 6 is a perspective view of an integrated testing and handler mechanism in accordance with the functional diagram of FIG. 5, according to a third embodiment.
Figure 7:
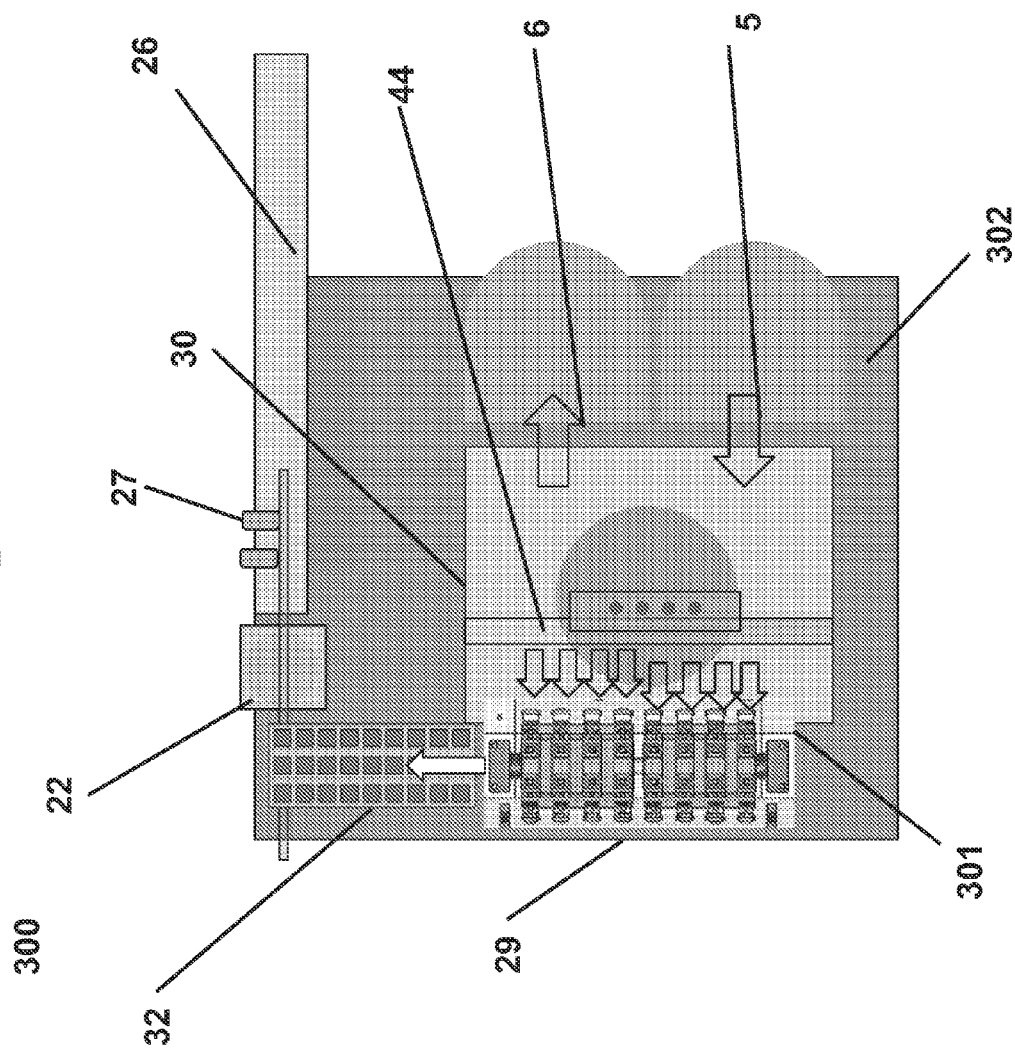
FIG. 7 is a top view schematic diagram of an integrated testing and handler mechanism of FIG. 6.

Referring to FIG. 6, an integrated testing and handler mechanism 300 includes a test module 301 and an input/output module 302. Components are tested in the test module 301 components while other components are being handled by the input/output module 302. The test module 301 and input/output module 302 are docked to one another in a horizontal manner.

The integrated testing and handler mechanism 300 includes a computer 40. The computer 40 is further configured to communicate with and control the test module 301 and the input/output module 302, and to analyze data therefrom. The computer is configured to monitor and assess the performance of the test module 301 and the input/output module 302.

Test Module

The integrated testing and handler mechanism 100 includes a test module 301.

The test module 301 of the integrated testing and handler mechanism 300 includes a rotary plunger 29 with Active Thermal Control ("ATC") such as that described in U.S. Pat. No. 7,355,428, issued on Apr. 8, 2008, which is hereby incorporated by reference in its entirety. The rotary plunger is configured to permit individual alignment of components. The rotary plunger 29 is provided with a plurality of conductive chucks 25 configures to hold components.

The rotary plunger 29 allows four steps to be done simultaneously. One group of components is loaded only a first side of the rotary plunger 29. Simultaneously, another group of components, located on a second side of the rotary plunger 29, are temperature soaked and vision inspected. Simultaneously, another group of components, located on a third side of the rotary plunger 29, are aligned and tested. Simultaneously, another group of components are unloaded from a fourth side of the rotary plunger 29 to an output shuttle 32. Each side of the rotary plunger may hold, for example, 16 components.

The integrated testing and handler mechanism 300 includes a vision inspection system 22 (e.g., 5S inspection).

The integrated testing and handler mechanism 300 is configured to permit visual alignment of components. Each component is picked individually by one head of the rotary plunger 29. After a 90° or 180° rotation, a camera measures a relative position of a component on the head of the rotary plunger 29. A controller is configured to forward position information derived from the measurement to an individually actuated alignment frame of a contactor array. After another 90° rotation, the head of the rotary plunger 29 plunges the component into a contactor socket. While the plunger head is moving into the socket, it simultaneously travels through the pre-adjusted alignment frame, thus correcting the positioning of the plunger head in x, y, and θ directions.

The test module 301 includes an alternating dual shuttle assembly 31. The alternating dual shuttle assembly includes two shuttles 32. While tested components are loaded one a first shuttle 32 from the rotary plunger, tested components from the second shuttle 32 are unloaded from the second shuttle 32 to a tape of the tape-and-reel.

Input/Output Module

The integrated testing and handler mechanism 300 includes an input/output module 302.

The input/output module includes an input section including an input cassette 5, and an output cassette 6. The input/output module includes an output section including a tape and reel output 26. Components are loaded into the input cassette 5 on film frames, and moved to a wafer table 30. Empty film frames are removed from the output cassette 6. Tested components are removed from the output reel 20 of a tape and reel output 26. Other input and output devices may be used, such as tubes, trays, or bulk devices.

The input/output module 302 includes a multi-function pick-and-place device 44. The multi-function pick-and-place device 44 sequentially picks up components from the wafer table 30, rotates the group of components by 90°, and moves the group of components to the rotary plunger 29. The multi-function pick-and-place device 44 is also configured to adjust its pitch (i.e., distance between components), to match the pitch of the rotary plunger. The multi-function pick-and-place device 44 is configured to plunge up to four devices (or other multiples of two) simultaneously on the rotary plunger 29.

The integrated testing and handler mechanism 300 also includes a single or dual pick-and-place device 27, which moves tested components from a shuttle 32 of the alternating dual shuttle assembly 31 to a tape of the tape and reel output 26.

The integrated testing and handler mechanism 300 further includes a reject container 21 configured to collect rejected components.

Operation of the Small Part Pick and Place System

The integrated testing and handler mechanism 300 of the third embodiment operates as follows. Components to be tested are loaded into the input cassette 5 of the input/output section 302 on film frames. The components are moved to the wafer table 30. The components are picked up from the wafer table 30 by the multi-function pick-and-place device 44. The multi-function pick-and-place devices rotates the components by 90°, adjusts the distance between components to match the pitch of the rotary plunger 29, and plunges the components in a horizontal direction into the conductive chucks 25 of the rotary plunger 29. While the components are on the rotary plunger, the active thermal control system heats the components via the conductive chucks 25. The rotary plunger 29 rotates the components by 90° (such that the components are facing upward), and a camera measures relative positions the component on the heads of the rotary plunger 29. A controller forwards position information derived from the measurement to an individually actuated alignment frame of a contactor array. After another 90° rotation, the heads of the rotary plunger 29 plunges the components into contactor sockets. While the plunger heads are moving into the contactor sockets, they travel through the pre-adjusted alignment frame, thus correcting the positioning of the plunger head in x, y, and θ directions. After testing is complete, the rotary plunger rotates another 90° (such that the components are facing downward), and the rotary plunger 29 transfers the tested components into a shuttle 32 of the alternating dual shuttle 31. The single or dual pick-and-place device 27 transfers the tested components onto a tape of the tape-and-reel output 26. Vision inspection is performed by the camera 27. Rejected components are removed from the tape. The remainder of the components are wound onto the reel 20 of the tape-and-reel output 26.

Variations on the First and Third Embodiments

Figure 8:
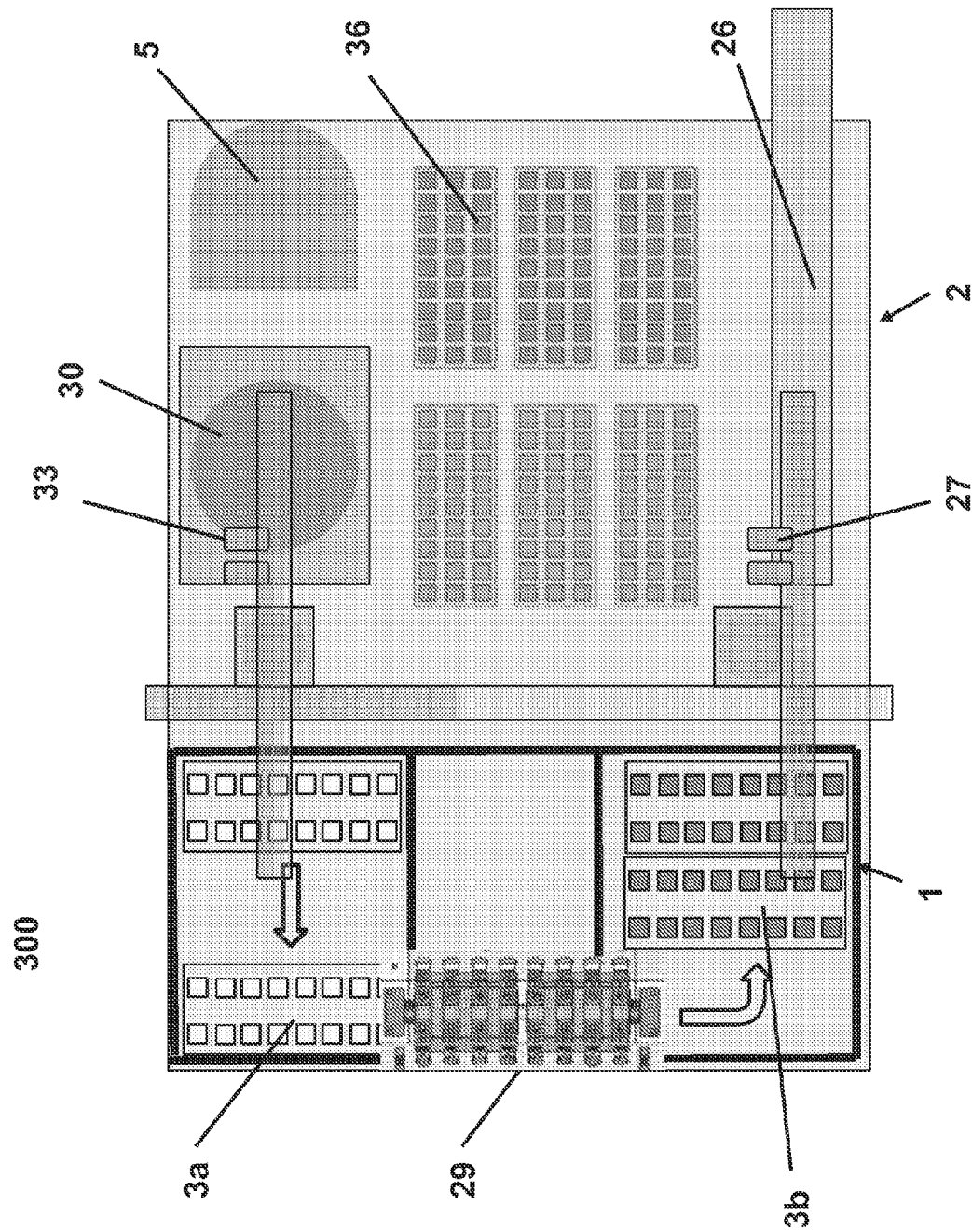
FIG. 8 is a top view schematic diagram of an integrated testing and handler mechanism in accordance with the functional diagram of FIG. 7, according to a fourth embodiment.

In a variation of the third embodiment, the multi-function pick-and place device of the third embodiment is replaced with a second single or dual pick and place device 33, which moves components from the wafer table 30 to a carrier 3. This alternative embodiment is shown in FIG. 8. Instead of the multi-function pick-and-place device moving parts directly from the wafer table 30 to the rotary plunger 29, the rotary plunger 29 picks up parts from the carrier 3.

Figure 9:
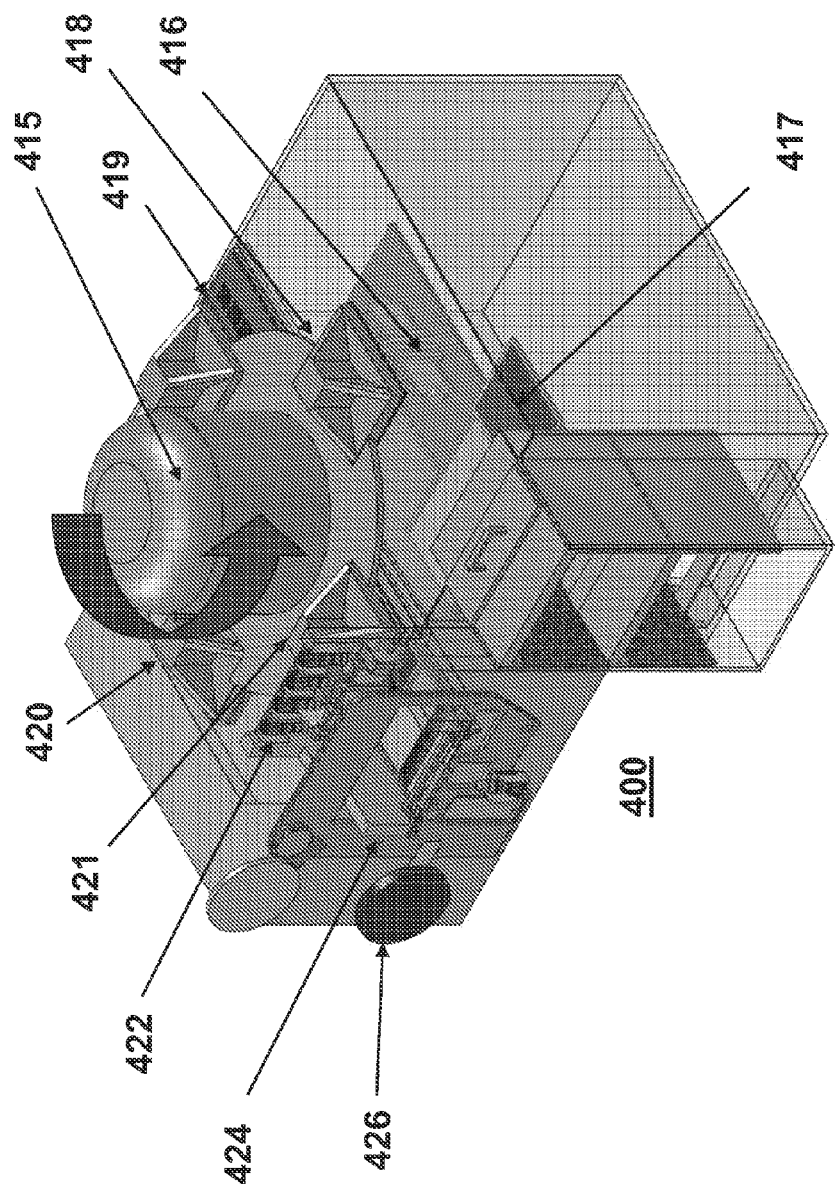
FIG. 9 is a perspective view of an integrated testing and handler mechanism in accordance with the functional diagram of FIG. 1, according to an alternative embodiment.

In a variation of the first embodiment, an integrated testing and handler mechanism 400 includes an input/output module and a test module both integrated with a turret 415. As shown in FIG. 9, the input/output module includes an input pick-and-place device with pitch-on-the-fly capability. The input/output module includes a wafer stage 417 configured to move in an x-direction, a y-direction, and a θ-direction.

The pick-and-place device 416 is a multiple pick-and-place device with pickup heads arranged around a horizontal axis at a 180° pitch. One side can load components from the wafer ring, where the other side can simultaneously load components onto the test head 418. The multiple heads can also perform pitch adaption. Components are picked sequentially from the wafer ring, but placed in one move (e.g., by row) onto the test head. The test heads can move in radial direction to allow the loading of multiple rows, and in z-direction to perform the plunging into the contactor array 420.

Station 419 is for vision aligning the components. Station 419 includes two sub-stations that move in a tangential direction under the test head 418. First the x-location, y-location, and θ-direction of all components are measured by one or more upward-looking cameras. After the measurement, the camera is moved aside and a plurality of individual alignment frames are moved under the components. The components are plunged through the alignment frames and thereby aligned according to the offsets measured by the upward-looking camera.

After the alignment, the components are moved by the test head to the contactor station and plunged into the contactor array 420. Station 419 and 420 may be combined into one station.

Station 421 is for vision inspection (e.g. 5S inspection) and tape and reel 423 unload. The test head unloads components by rows into an unload shuttle, which is located below the test head and can move in a radial direction. The components are inspected row-by-row by multiple cameras 422 and then placed by a fast single pick-and-place device 424 into the tape and reel. The pick-and-place device can move in a radial direction and a tangential direction. Components that fail testing are put into reject containers. The shuttle may be a single or an alternating dual shuttle.

Integrated Testing and Handling Methods

Figure 10:
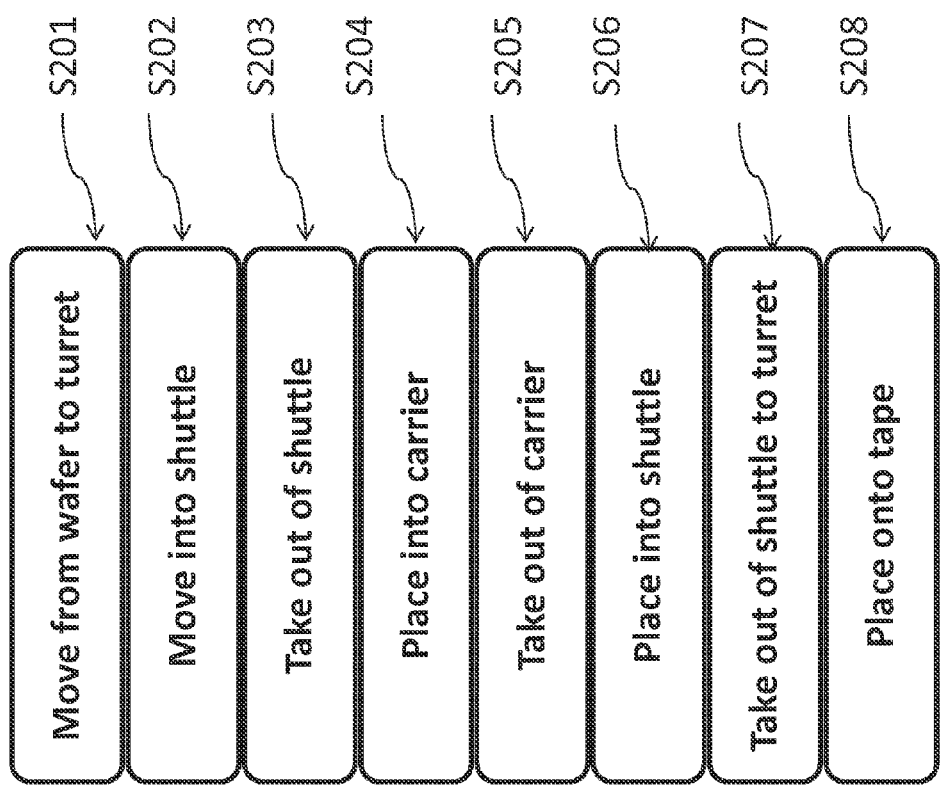
FIG. 10 is a flow diagram for a method of testing and handling according to an embodiment of the invention.

FIG. 10 shows a method for performing testing and handling with an integrated testing and handling mechanism. The method includes moving at least one component from a wafer to a turret (step 201) and moving the at least one component into a shuttle (step 202). The method further includes taking the at least one component out of the shuttle (step 203), placing the at least one component into a carrier (step 204), taking the at least one component out of the carrier (step 205), and placing the at least one component into the shuttle (step 206). The method additionally includes taking the at least one component from the shuttle and placing it in the turret (step 207) before placing the at least one component onto a tape of a tape-and-reel system (step 208).

Fourth Embodiment Carrier Transfer Type Pick and Place System

Figure 11:
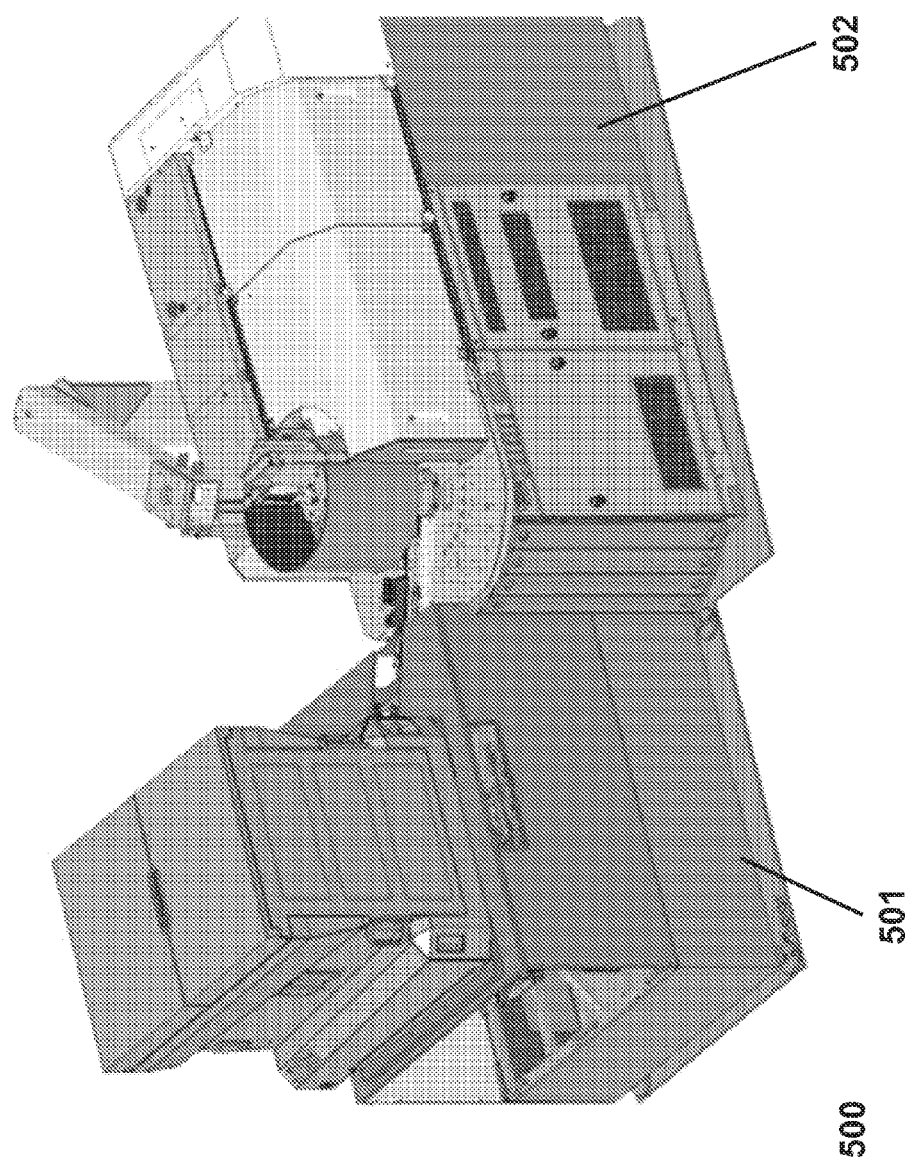
FIG. 11 is a perspective view of an integrated testing and handler mechanism according to a fourth embodiment.

Referring to FIG. 11, an integrated testing and handler mechanism 500 includes a test module 501 and an input/output module 502. Components are tested in the test module 501 while other components are being handled by the input/output module 502. The test module 501 and the input/output module 502 are docked to one another in a horizontal manner. Components suitable for handling by the input/output module 502 and the test module 501 include bumped die (WLP) type devices, bare die type devices, and Flat No-Leads Packages (such as quad-flat no-leads (QFN) packages and dual-flat no-leads (DFN) packages).

Test Module

The integrated testing and handler mechanism 500 includes a test module 501.

Figure 12:
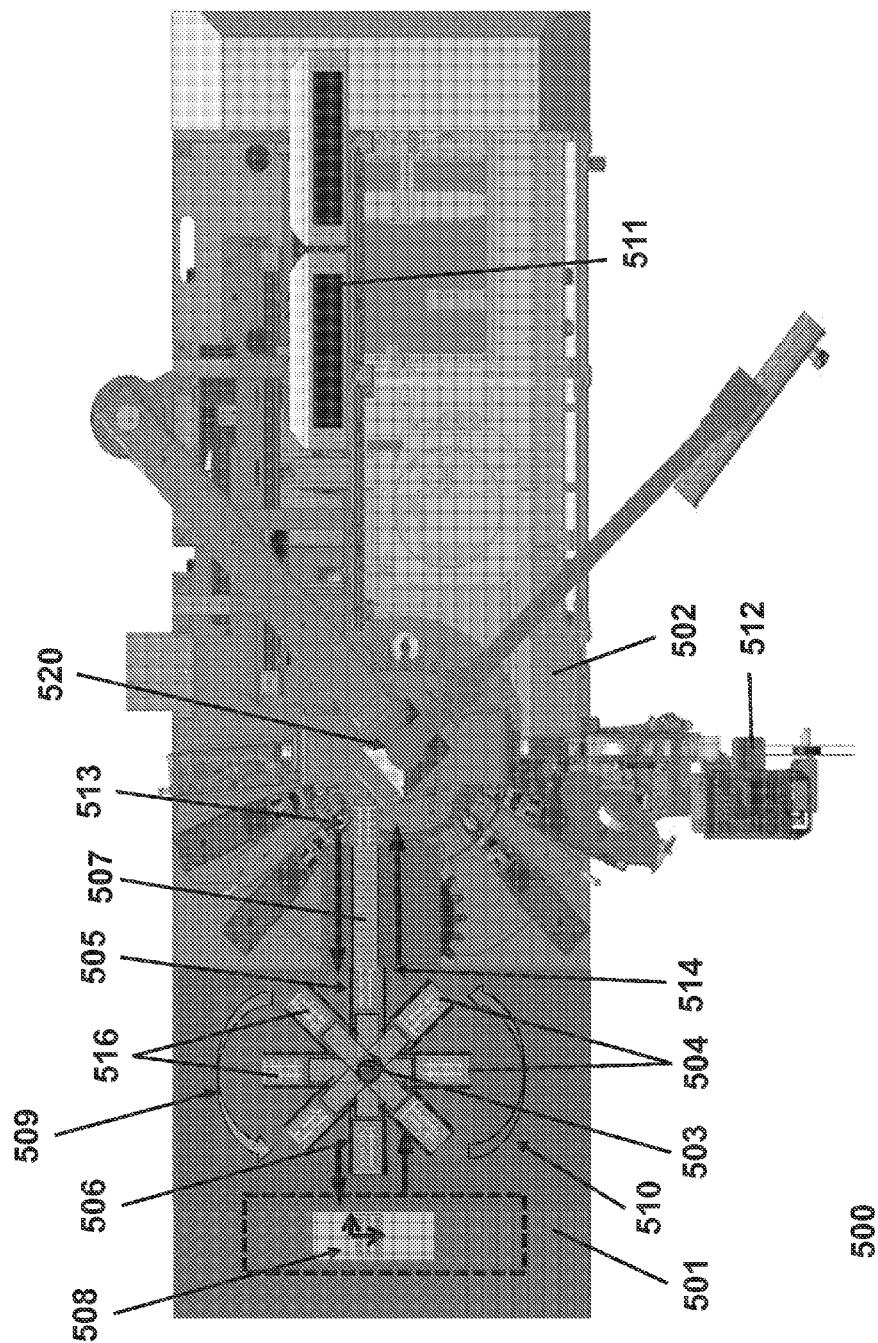
FIG. 12 is a top view schematic diagram of an integrated testing and handler mechanism according to a fourth embodiment.
Figure 13:
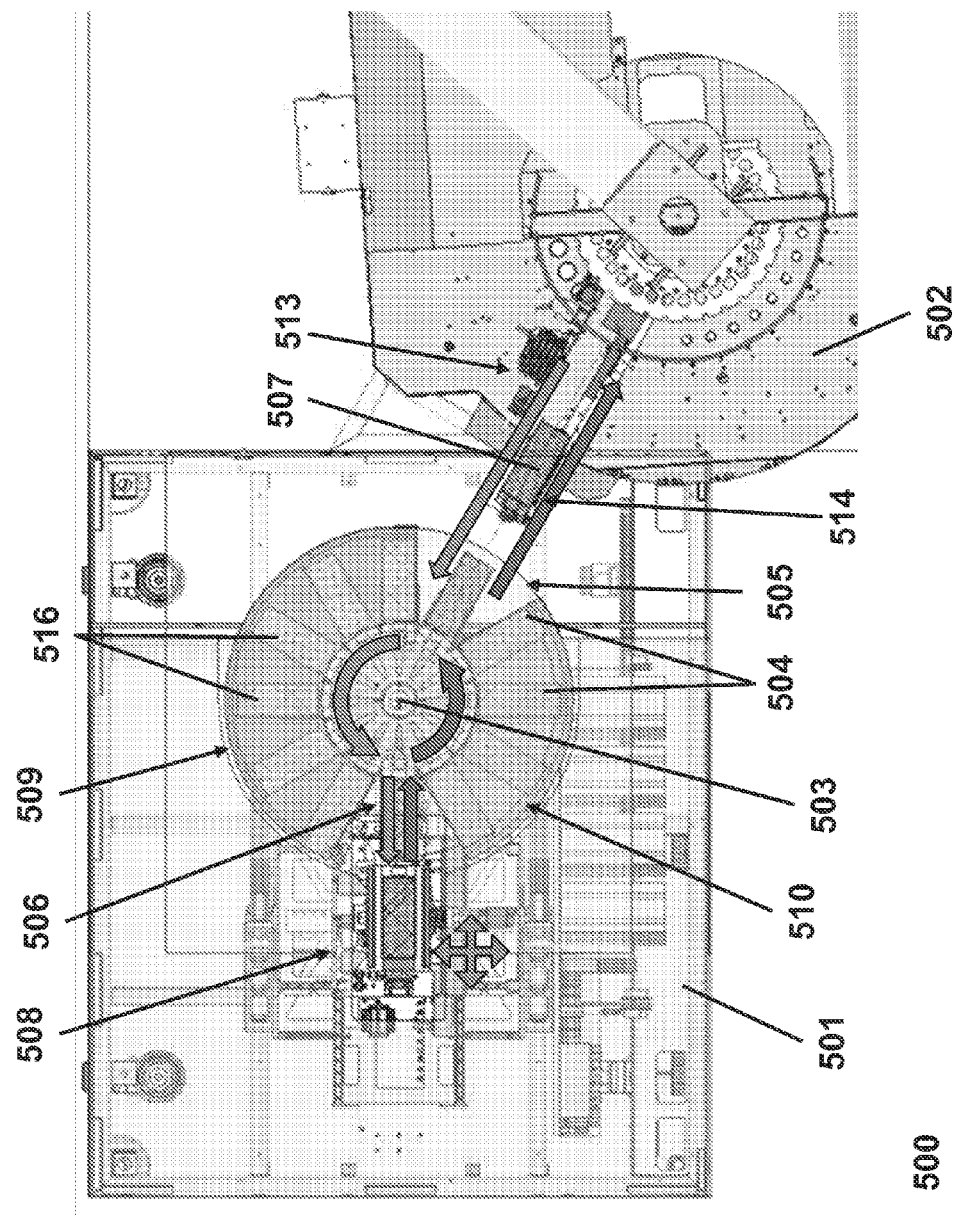
FIG. 13 is another top view schematic diagram of an integrated testing and handler mechanism according to a fourth embodiment.

Referring to FIGS. 12 and 13, the test module 501 includes a contactor area 508 at which components are tested. A test head having a plurality of test sockets is located above the contactor area 508. After a carrier 600 is moved to the contactor area 508, a plunger moves the carrier 600 upward so that the components are inserted into the test sockets. The plunger and test head are configured such that the simultaneous testing of all components in the carrier 600 may be performed, or testing of only a subset of the components in the carrier 600 may be performed. The plunger and test head may be configured similarly to those in the Jaguar strip handler, produced by Rasco GmbH.

The test module 501 includes a plurality of carrier stations 504. In the embodiment shown in FIG. 12, the rotary table 503 includes eight carrier stations 504. In the embodiment shown in FIG. 13, the rotary table 503 includes twelve carrier stations 504. The number of carrier stations 504 may range from one to twelve or greater, preferably between two and twelve, and more preferably between eight and twelve.

The test module 501 includes a rotary table 503. The rotary table 503 includes a plurality of grippers. In this embodiment, the rotary table 503 includes one gripper per carrier station 504. The grippers rotate in a circle from an input/output module transfer location 505 to a plunger transfer location 506 and then back to the input/output module transfer location 505. The grippers are configured to retrieve a carrier 600 from a shuttle 507 of the input/output module 502, hold the carrier 600 while the rotary table rotates the grippers around the rotary table by an index angle (for example, 30° where there are twelve carrier stations) to the carrier stations 504, transfer the carrier 600 to the contactor area 508, and return the carrier 600 to the shuttle 507.

The test module 501 further includes a conductive soaking module located in a conductive soaking area 509. The soaking module is configured to bring components to required test temperatures (for example, temperatures between −60° C. and 160° C.). For cold soaking, the soaking area may be held in a dry atmosphere (e.g., gaseous nitrogen or dry air with a dew point below −70° C.) to prevent condensation of water on the components or carriers 600. The soaking module is a boat based soaking module in which a carrier 600 holding untested components is brought to a test temperature by moving the carrier 600 over a hot or cold plate in the conductive soaking area 509. The test module 501 also includes a de-soaking area 510 in which the components are returned (or at least partly returned) to room temperature. The hot or cold plates are located in the carrier stations 504 so that, when the gripper moves the carrier 600 into a carrier station 504 in the conductive soaking area or the de-soaking area, the gripper lowers the carrier onto a hot or cold plate in the carrier station 504. To improve the heat transfer from the hot or cold soaking plate, a vacuum can be applied to suck the carrier down to the plate. The plunger and the contact sockets are also kept at test temperature.

In the test modules 501 shown in FIGS. 12 and 13, the grippers rotate counter-clockwise around the rotary table 503. However, the grippers may, alternatively, rotate clockwise around the rotary table 503. The rotary table 503 is configured such that, when carriers 600 are held by the grippers, the carriers 600 are aligned radially outward from a rotational axis of the rotary table 503, and remain radially aligned while the carriers 600 rotate around the rotary table 503.

The test module 501 includes a vision alignment system. The vision alignment system permits visual alignment of groups of components. The carrier 600 and/or the array of components on the carrier 600 can be aligned in the x, y, and θ directions to the test head and/or the array of test sockets of the test head. In this embodiment, the vision alignment system includes cameras that measure positions of fiducial markers located on the carrier 600 and fiducial markers located on the test head. Based on offsets of corresponding fiducial markers, a position controller for the plunger is configured to move the plunger such that the components in the carrier 600 are aligned to the test sockets of the test head.

Input/Output Module

The integrated testing and handler mechanism 500 includes an input/output module 502.

The input/output module 502 of the mechanism transports untested components from an input device located in an input section 511 to carriers 600, transports the carriers 600 on a shuttle 507 to and from a location where the carriers 600 can be retrieved by grippers of the carrier stations 504, and transports tested components from the carriers 600 to an output device located in an output section 512. The input device is a film frame device, a tube type device, a bowl type device, or a detaping device for tape and reel packages. The output device is a tube type device (holding one bin), a bulk type device (holding, for example, eight bins), or a tape and reel device (holding one bin).

The input/output module 502 includes a single shuttle 507 that transfers carriers 600 between a component loading location 513 and a test module transfer location 514. The shuttle 507 includes precision linear encoders configured to move the carrier 600 in the x and y directions. Components are transferred into carriers 600 on the shuttle 507 at the component loading location 513. The carriers 600 are retrieved by grippers of the rotary table at the test module transfer location 514.

The input/output module 502 is turret based, including a turret 520. For example, the input/output module 502 may be configured similarly to the NY20 turret handler, or the NY32 turret handler, available from Cohu, Inc. The turret 520 includes a plurality of pickup heads 515 that rotate around the turret 520 for moving components to be tested to the carriers 600 from the input section 511 and from the carriers 600 to the output section 512. Loading and unloading is done simultaneously. The turret 520 picks a tested device and replaces it by an untested device, until the entire carrier 600 is populated by untested devices. The input/output module 502 preferably has a throughput of at least 22,000 components per hour.

Carriers

Figure 14:
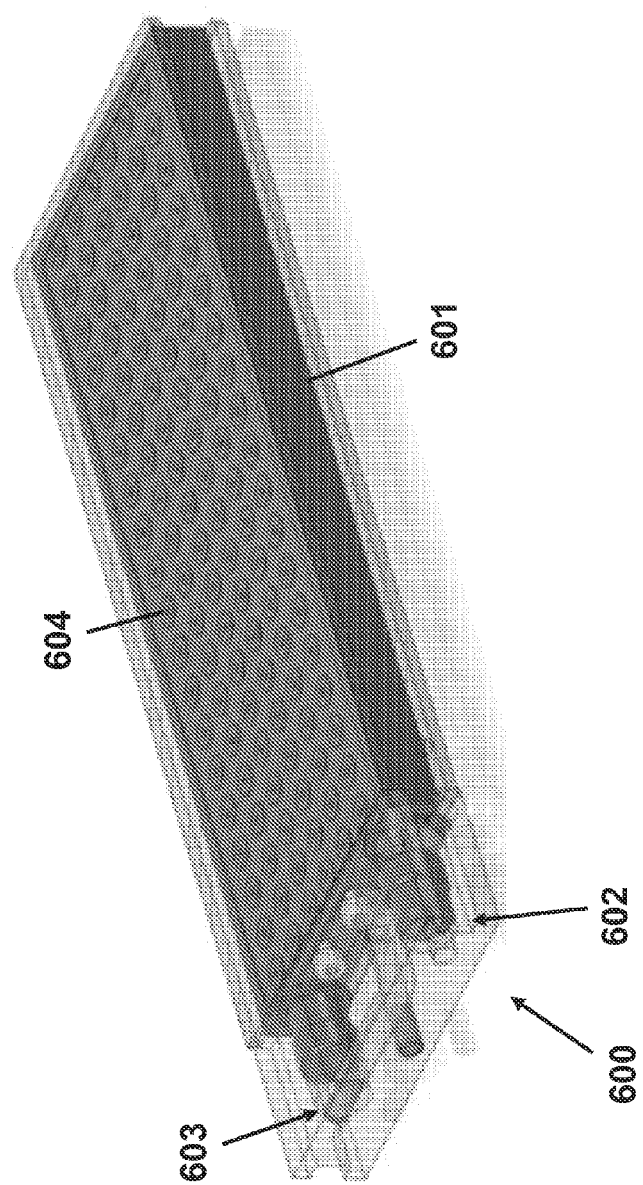
FIG. 14 is a perspective view of a carrier in accordance with an embodiment of the invention.
Figure 15:
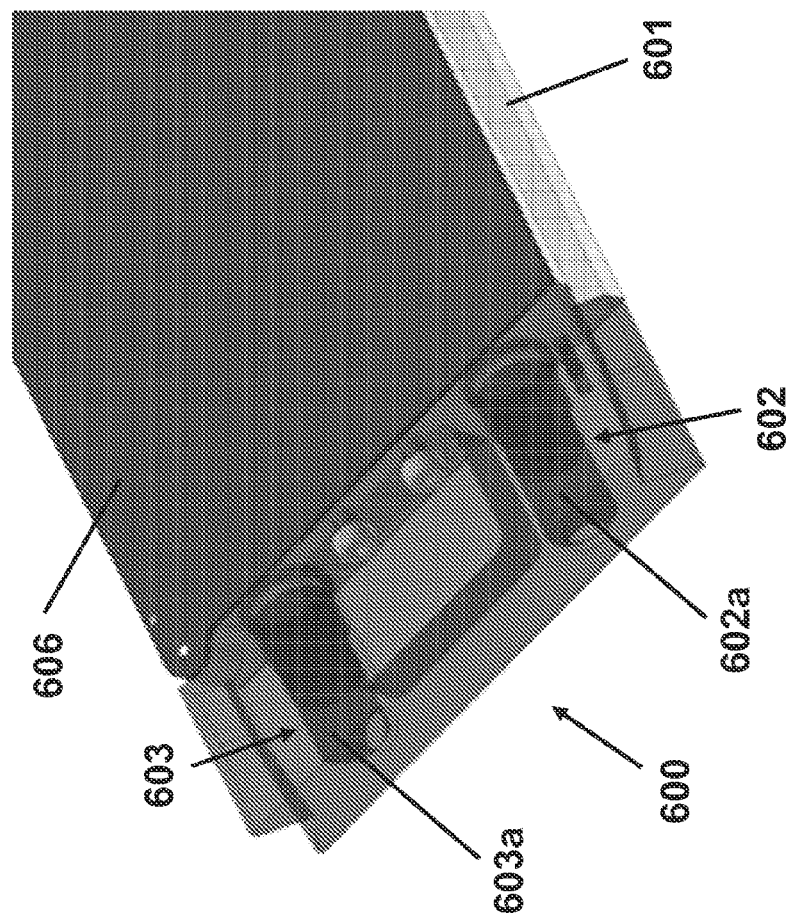
FIG. 15 is a perspective view of a portion of a carrier in accordance with an embodiment of the invention.
Figure 16:
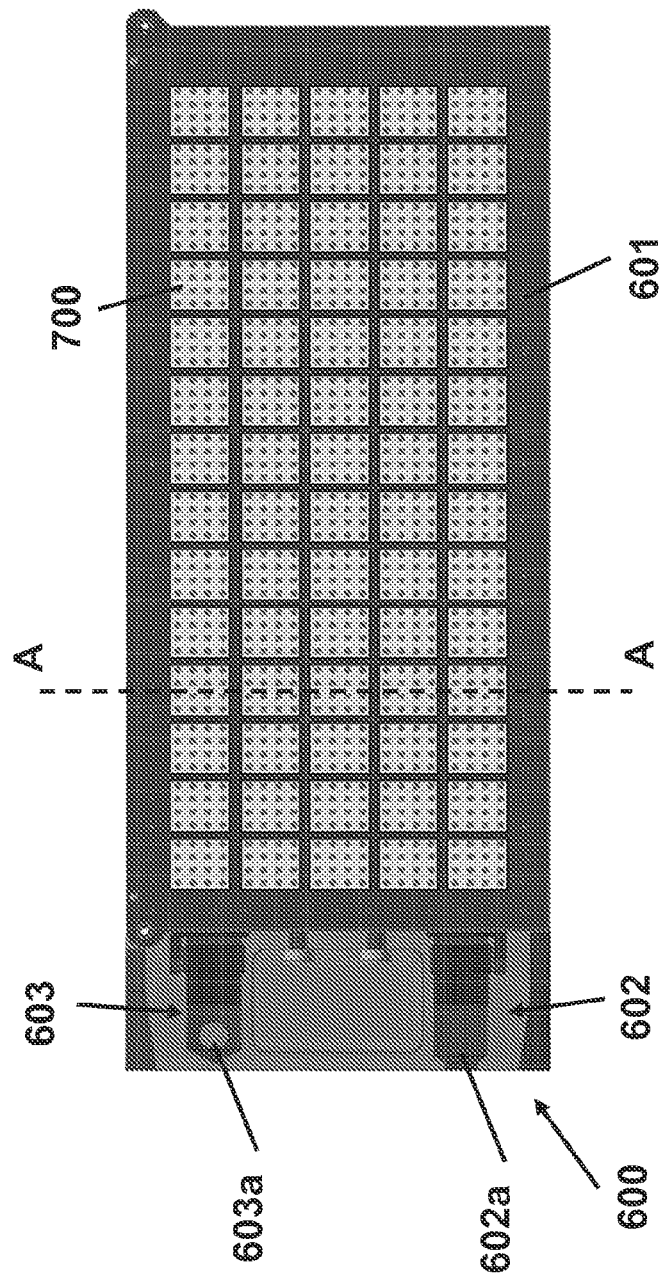
FIG. 16 is a top view of a carrier in accordance with an embodiment of the invention.

In the fourth embodiment, the carriers 600 are vacuum carriers, as shown in FIGS. 14-18. The carriers 600 include a main body 601, a front vacuum interface 602, and a bottom vacuum interface 603, as shown in FIGS. 14-16. The front vacuum interface 602 includes a one-way valve 602a, and the bottom vacuum interface 603 includes a one-way valve 603a.

Figure 17:
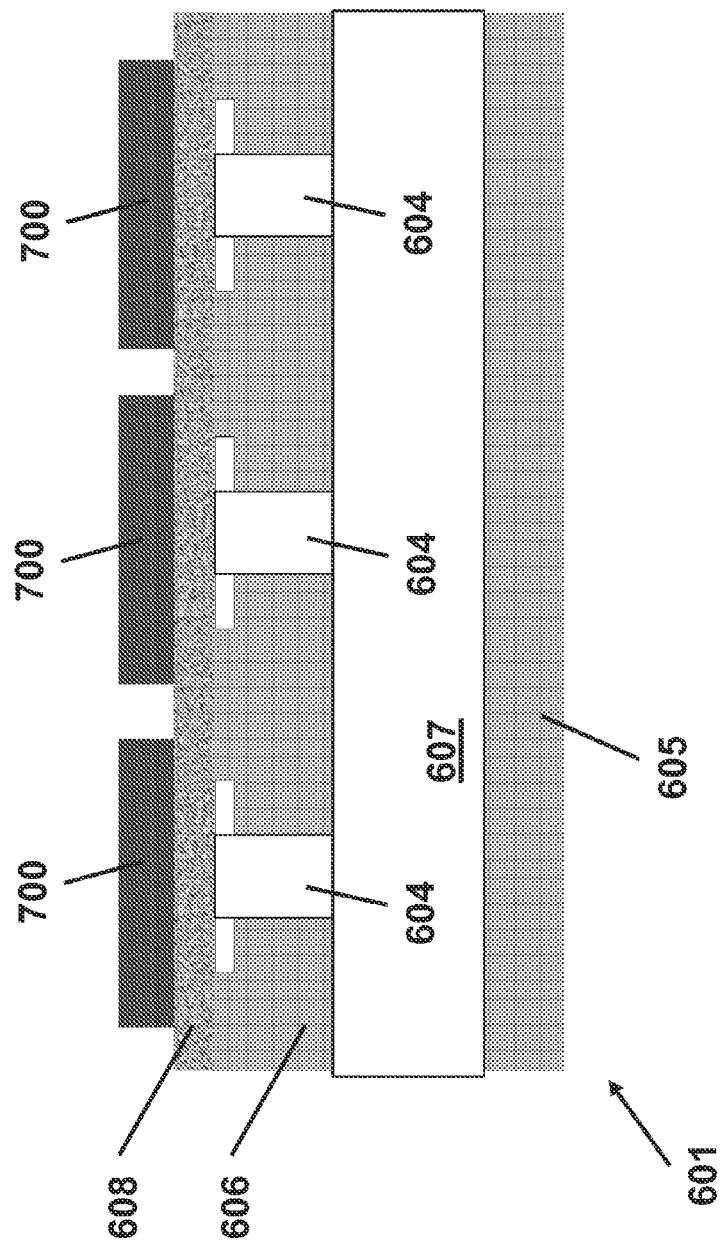
FIG. 17 is a cross-sectional view of a carrier, taken along a portion of the line A-A in FIG. 16, in accordance with an embodiment of the invention.
Figure 18:
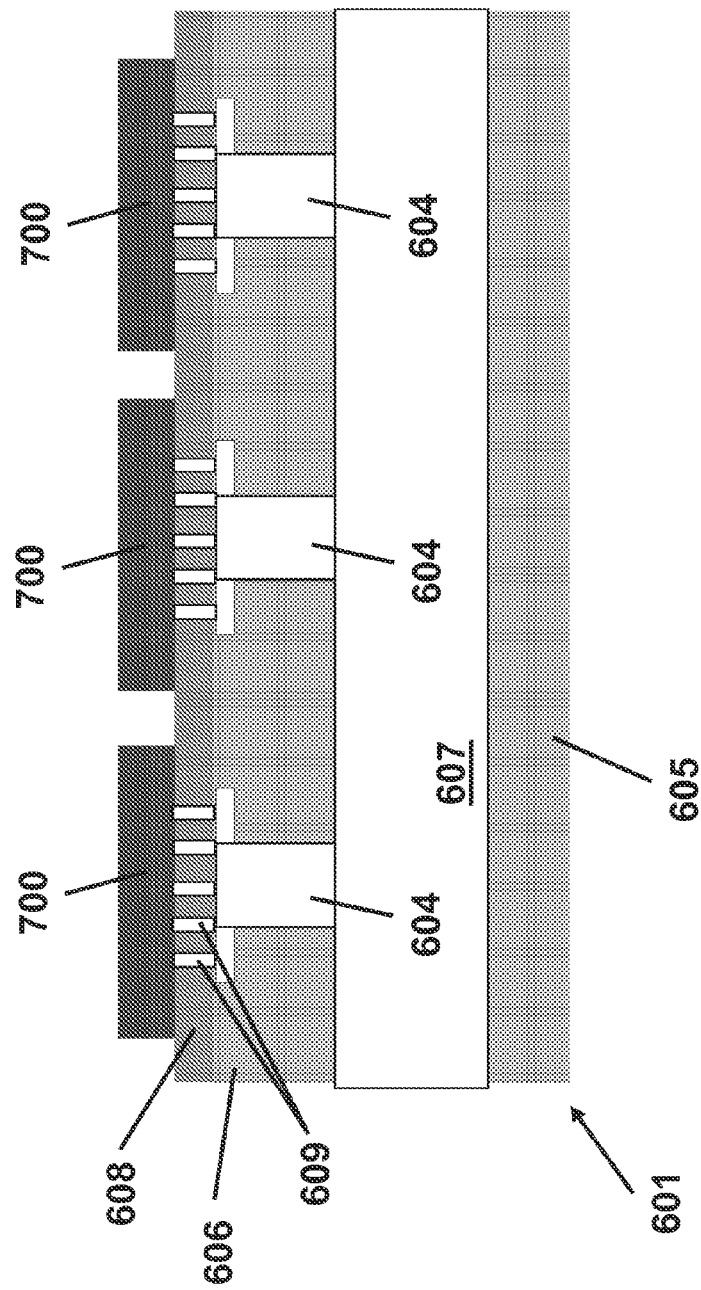
FIG. 18 is a cross-sectional view of a carrier, taken along a portion of the line A-A in FIG. 16, in accordance with another embodiment of the invention.
Figure 19:
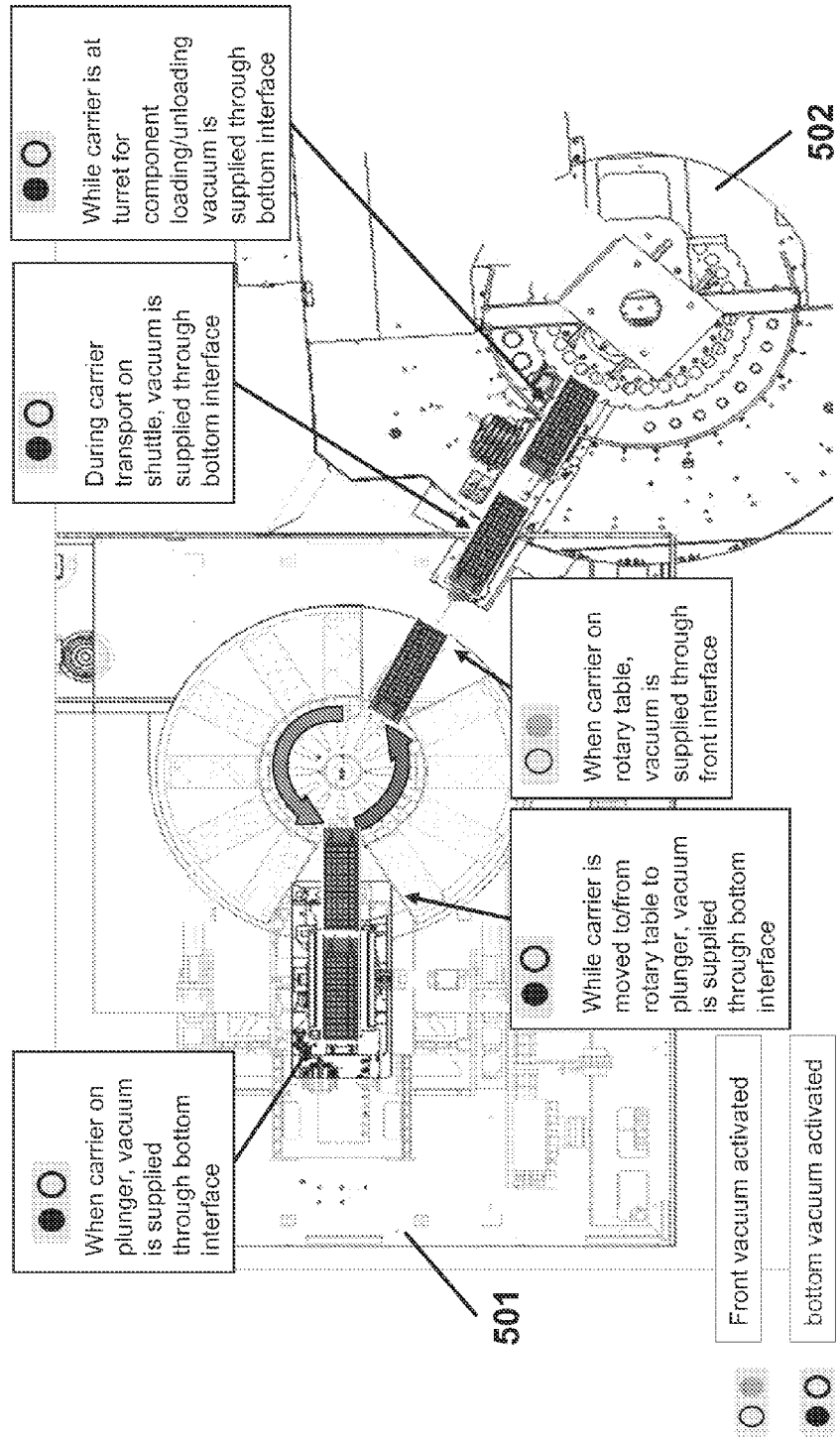
FIG. 19 is a top view schematic diagram of an integrated testing and handler mechanism, showing vacuum usage during material flow.

FIGS. 17 and 18 depict cross-sectional views of the main body 601 of a carrier 600 along part of the line A-A as shown in FIG. 16. The main body 601 includes a lower body portion 605, an upper body portion 606, and a central vacuum supply chamber 607 located between the lower body portion 605 and the upper body portion 606. A component placement layer 608 is disposed over the upper body portion 606. The top surface of the component placement layer 608 is planar, without any apertures (commonly called a "kit") to physically hold components in place. A plurality of vacuum supply cavities 604 extend through the upper body portion 606 from the central vacuum supply chamber 607 to the component placement layer 608. The carrier 600 includes one or more vacuum supply cavities 604 for each component 700. Thus, a vacuum can be supplied to the central vacuum supply chamber 607 via one or both of the front vacuum interface 602 and the bottom vacuum interface 603. This vacuum is supplied to the vacuum supply cavities 604 and the component placement layer 608, thereby allowing components 700 to be held on the component placement layer 708. A working area of a top surface of the carrier 600 may be, for example, about 130 mm by 55 mm.

In the embodiment shown in FIG. 17, the component placement layer 608 is made of a porous conductive material, such as a porous aluminum material. The material of the component placement layer 608 is non-sintered. A thermal conductivity of the material of the component placement layer 608 is between 50 and 150 W/mK. The size of the pores in the component placement layer 608 is between 5 and 200 microns. In this embodiment, vacuum can be supplied to the pores of the porous conductive material via the vacuum supply cavities 604, thereby allowing components 700 to be held on a top surface of the component placement layer 708.

In the embodiment shown in FIG. 18, the component placement layer 608 include a plurality of micro-holes 609 that extend through the component placement layer 608 from each of the vacuum supply cavities to an upper surface of the component placement layer 608. The component placement layer 609 is made of a conductive material. A thermal conductivity of the material of the component placement layer 609 is between 50 and 150 W/mK. A width of the holes is between 5 and 200 microns. In this embodiment, vacuum can be supplied to the micro-holes 609 of the component placement layer 608 via the vacuum supply cavities 604, thereby allowing components 700 to be held on a top surface of the component placement layer 708.

Vacuum Supply to Carriers

Because components 700 are held on the carrier 600 via vacuum, an uninterrupted vacuum supply is maintained while the carrier 600 is at the turret 520 of the input/output module 502 for component loading and unloading, during carrier transport on the shuttle 507, while the carrier is transferred from the shuttle 507 to the rotary table 503, while the carrier is moved from the rotary table 503 to the plunger for testing, while the carrier is on the plunger during testing, and during the entire return transport process from the plunger back to the shuttle. This is accomplished via a "handshake" process using the front and bottom vacuum interfaces 602, 603 of the carrier 600.

While the carrier 600 is at the turret 520 of the input/output module 502 for component loading/unloading, and during carrier transport on the shuttle 507, vacuum is supplied to the carrier 600 by an input/output module vacuum source via the bottom vacuum interface 603 of the shuttle 507. After completion of the carrier loading/unloading, the shuttle 507 moves the carrier 600 into the gripper of the rotary table 503. When the carrier 600 has reached the bottom of the gripper, the vacuum is then supplied through the front vacuum interface 602 of the carrier by the rotary table/gripper. Then, bottom vacuum supply through the shuttle is switched off (handshake) This vacuum source continues to supply vacuum to the carrier 600 while the carrier 600 is moved by the rotary table over the conductive soaking area 509. When the carrier 600 reaches the plunger transfer location 506, vacuum is then supplied to the carrier 600 by a plunger vacuum source via the bottom vacuum interface 603. The plunger moves under the gripper of the rotary table 503, docks to the carrier (the rotary table with the carrier 600 moves around 3 mm downwards to place the carrier onto the plunger) and then supplies vacuum from the bottom vacuum interface 603 through the plunger to the carrier 600. After the vacuum supply from the plunger has been established, the vacuum from the rotary table/gripper is switched off and then the carrier 600 is moved out of the gripper by the plunger, maintaining the vacuum.

The plunger can perform now the contacting movements in x,y and z direction. The carrier can either be moved stepwise or in total. To transport the carrier 600 back to the rotary table 503, the plunger moves the carrier 600 back into the gripper (radial movement) of the rotary table 503. When the carrier 600 has reached the bottom of the gripper, the vacuum is then supplied through the front vacuum interface 602 of the carrier 60. After the vacuum supply is transferred back to the rotary table. The bottom vacuum supply from the plunger is switched off. This vacuum source continues to supply vacuum to the carrier 600 while the carrier 600 is moved by the rotary table through the de-soaking area 510. When the carrier 600 reaches the input/output shuttle transfer location 505, vacuum is then supplied to the carrier 600 by an input/output module vacuum source via the bottom vacuum interface 603. This vacuum source continues to supply vacuum to the carrier 600 while during carrier transport on the shuttle 507 and while the carrier 600 is at the turret 520 of the input/output module 502 for component unloading The shuttle 507 moves under the gripper of the rotary table 503, docks to the carrier 600 (the rotary table with the carrier moves around 3 mm downwards to place the carrier onto the shuttle) and supplies vacuum through the bottom vacuum interface 603 through the shuttle 507. After the vacuum supply from the shuttle 507 has been established, the vacuum from the rotary table 503 is switched off and then the carrier 600 is moved out of the gripper by the shuttle 507. The shuttle 507 then moves the carrier 600 to the loading/unloading area of the turret 520.

The integrated testing and handler mechanism 500 includes a back-up vacuum system that includes a venturi generator that will maintain vacuum if primary vacuum is lost. The vacuum level of all stations is monitored by vacuum sensors. When the primary vacuum drops, the backup system steps in immediately.

Vision Alignment for Placement of Component on Carriers

The integrated testing and handler mechanism 500 includes a vision alignment system for placement of components on the carriers at the input/output module 502. This vision alignment system includes first and second downward-looking cameras 701, 703 and an upward-looking camera 702. The vision alignment system further includes an alignment table 704 configured to hold components via vacuum. The vision alignment system further includes a controller configured to control movement of the alignment table 515 and of the precision linear encoders of the shuttle based on information received from the cameras 701, 702, 703.

Figure 20:
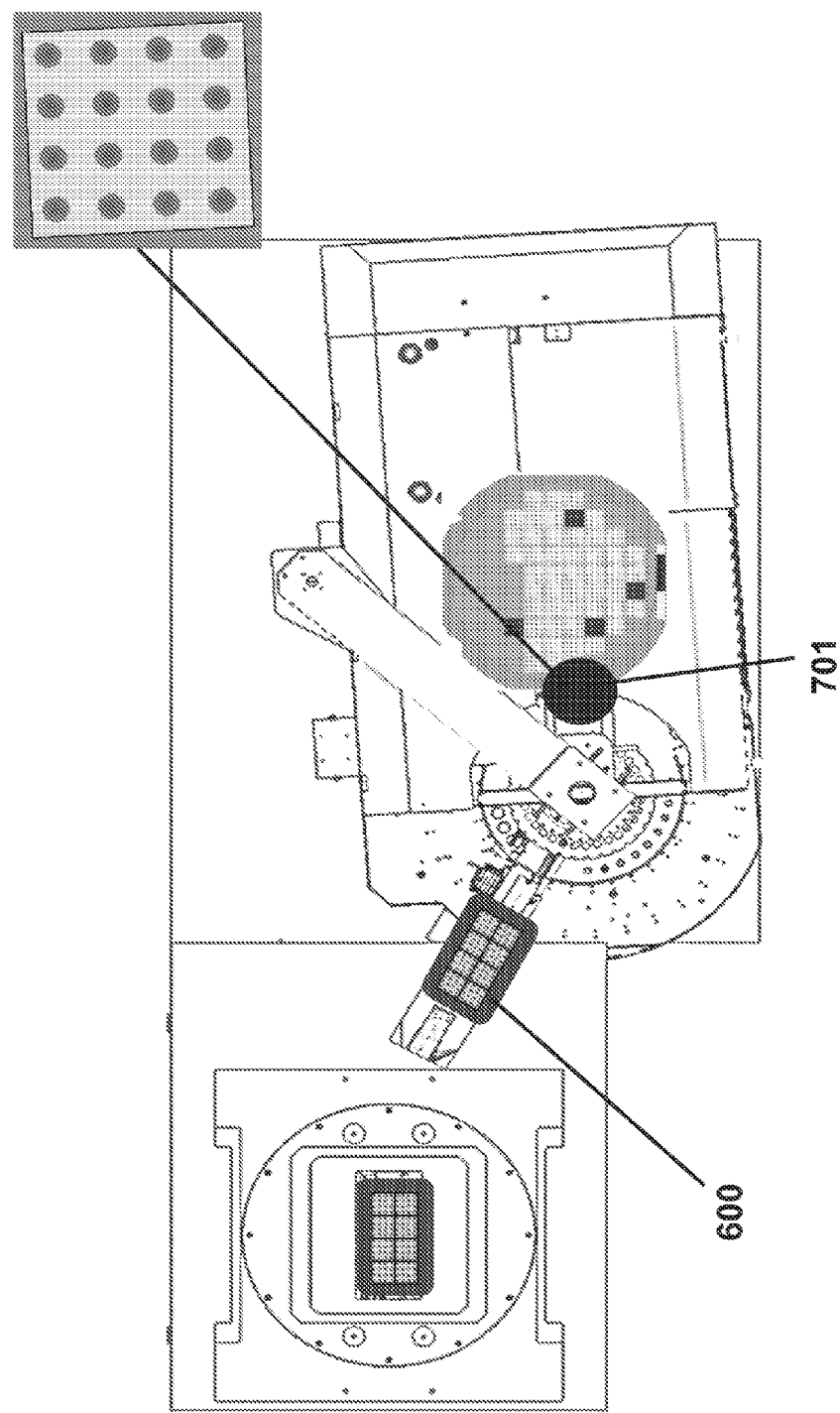
FIG. 20 is a top view schematic diagram of an integrated testing and handler mechanism, demonstrating a first step of a vision alignment process.

Visional alignment will be described with reference to FIGS. 20-24. First, as shown in FIG. 20, the first downward-looking camera 701 views a component to be transferred to the carrier 600 while the component is deadbug (i.e., while the contacts of the component face upwards). Based on information received from the downward-looking camera 701, the controller determines the translational and angular offset (x, y, θ) between the contact pattern of the component and the package outline of the component, as shown in the inset view at the top right of FIG. 20.

Figure 21:
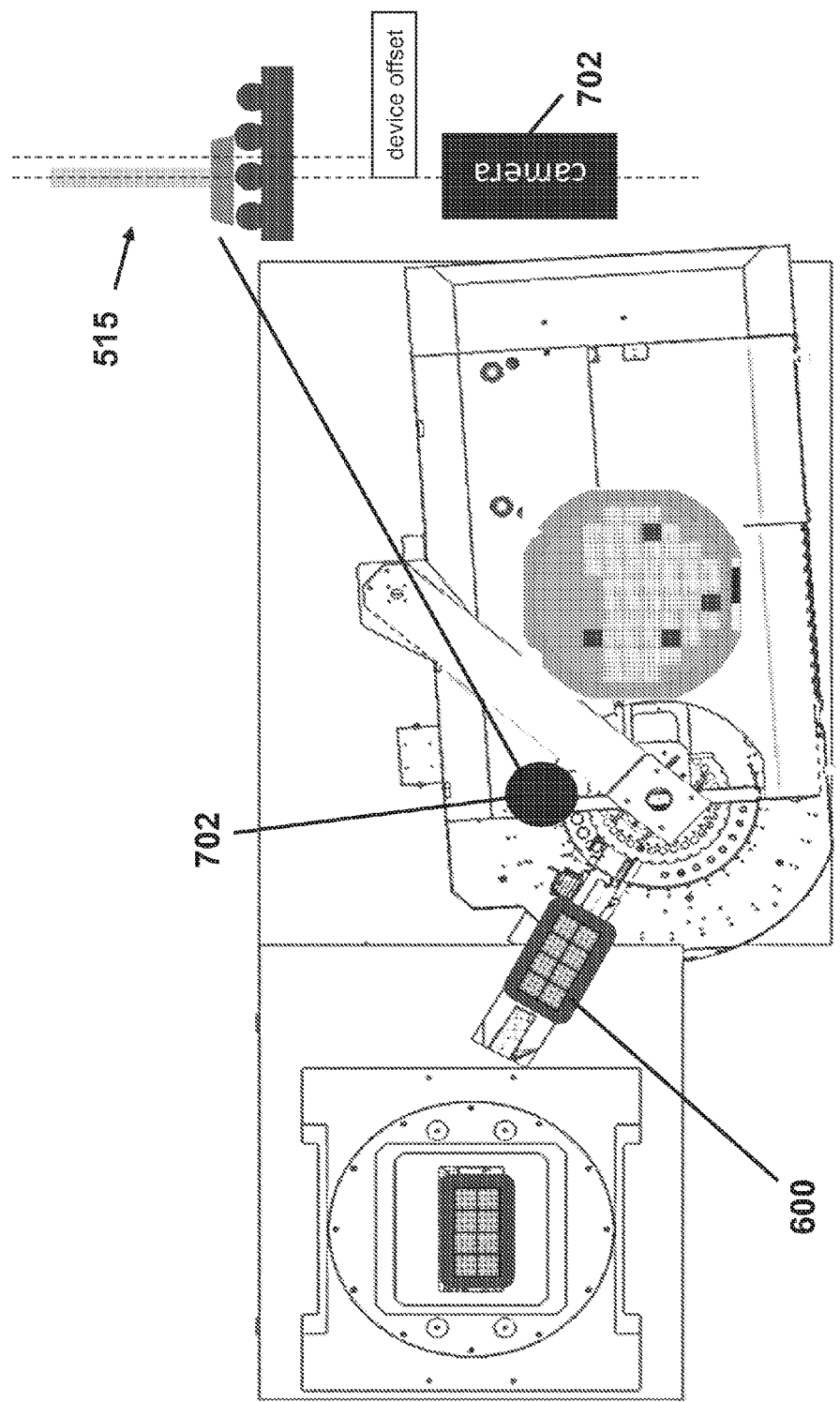
FIG. 21 is a top view schematic diagram of an integrated testing and handler mechanism, demonstrating a second step of a vision alignment process.

Next, as shown in FIG. 21, the pickup head 515 picks up the component, and the upward-looking camera 702 views the pickup head 515 while holding the component. Based on information received from the upward-looking camera 702, the controller determines the translational and angular offset (x, y, θ) between the package outline of the component and the pickup head 515.

Figure 22:
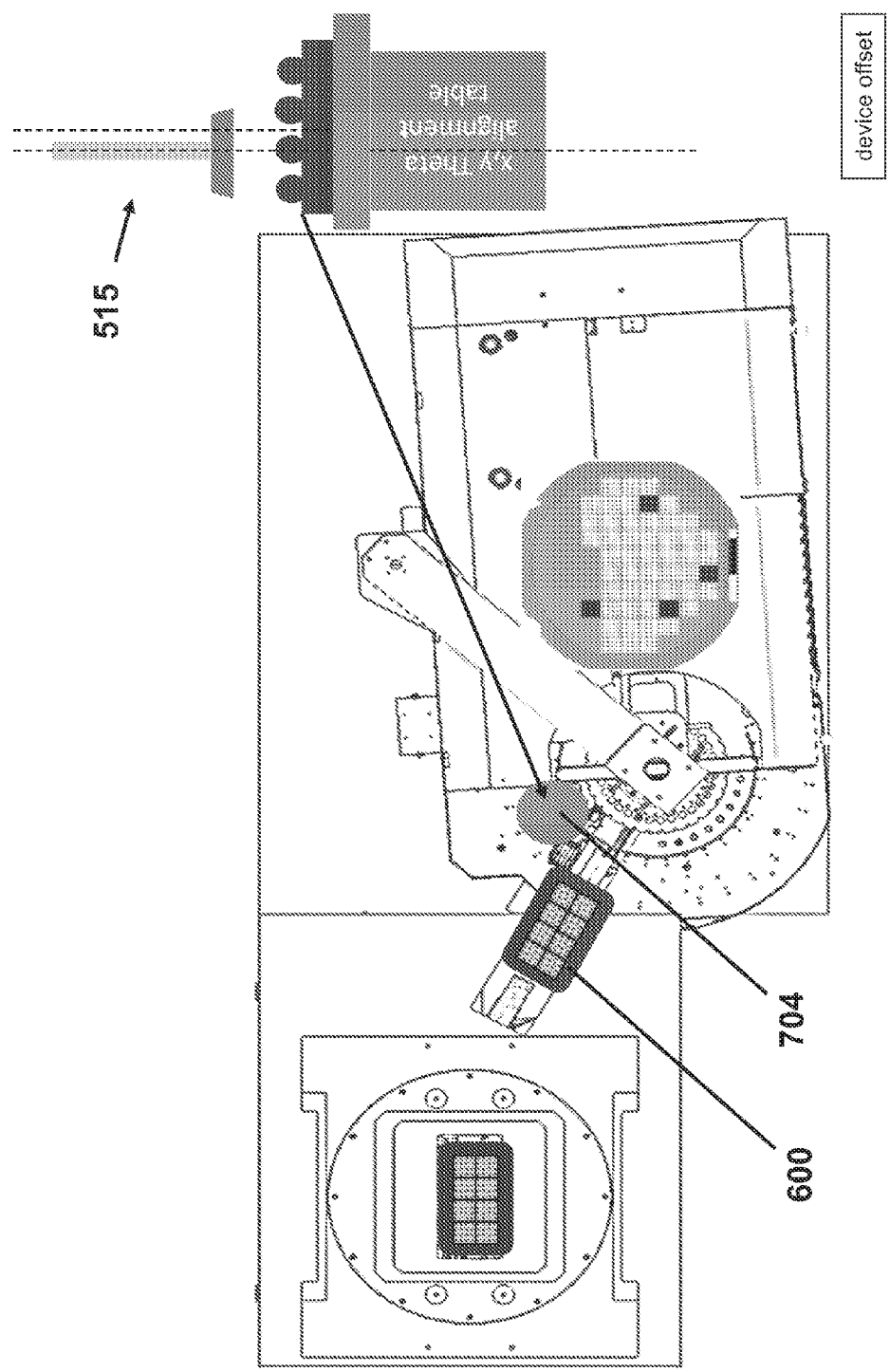
FIG. 22 is a top view schematic diagram of an integrated testing and handler mechanism, demonstrating a third step of a vision alignment process.

Next, as shown in FIG. 22, the pickup head 515 places the component on the alignment table 704, where the component is held by vacuum. The pickup head is then retracted. The controller then causes the alignment table 704 to move such that the component is aligned to the pickup head, based on the determined translational and angular offset (x, y, θ) between the package outline of the component and the pickup head 515. After alignment, the pickup head 515 again picks up the component.

Figure 23:
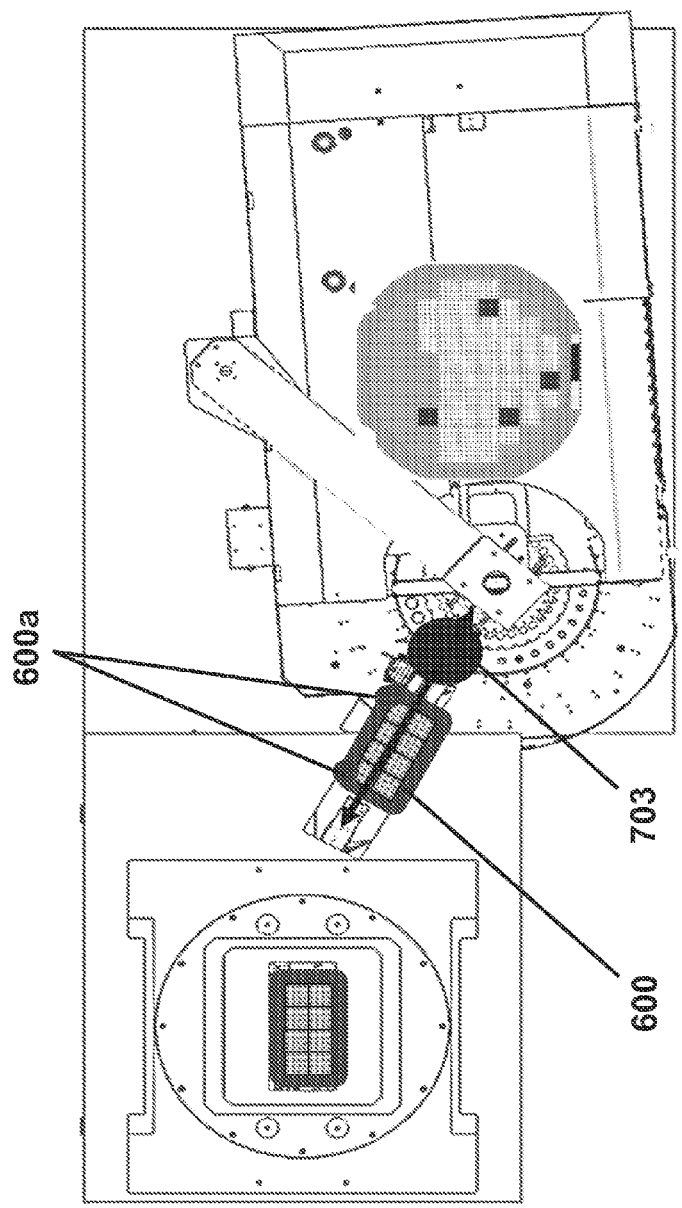
FIG. 23 is a top view schematic diagram of an integrated testing and handler mechanism, demonstrating a fourth step of a vision alignment process.

Next, as shown in FIG. 23, the second downward-looking camera 703 views the carrier 600 on which the component is to be placed. The carrier 600 includes two fiducials 600a, one at each end of the carrier 600. By moving the carrier 600 in the longitudinal direction along the shuttle 507 under the second downward-looking camera 703, the controller determines the translational and angular offset (x, y, θ) between the carrier 600 and the pickup head 515. If the carrier 600 is still at an elevated temperature from conductive soaking, the thermal elongation of the carrier 600 can also be determined by the controller.

Figure 24:
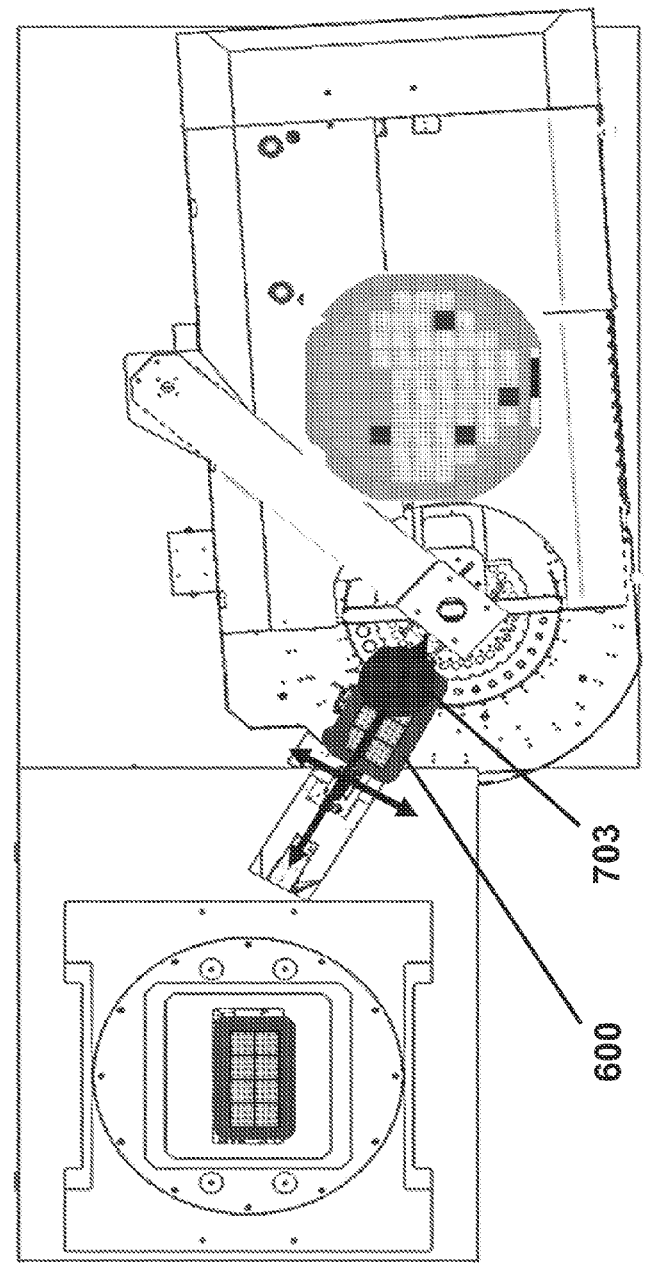
FIG. 24 is a top view schematic diagram of an integrated testing and handler mechanism, demonstrating a fifth step of a vision alignment process.
Figure 25:
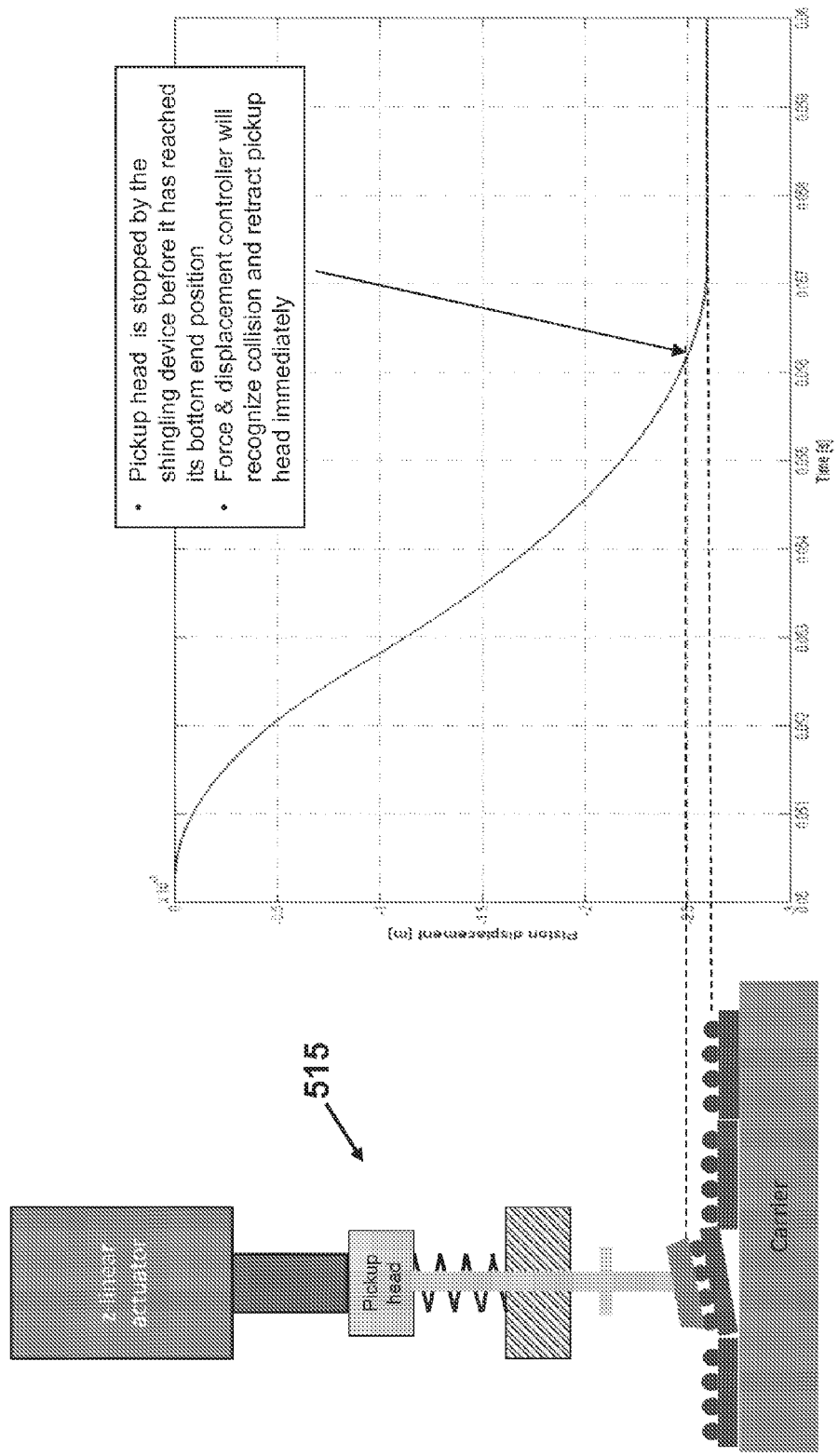
FIG. 25 is a side schematic diagram of pickup head and carrier, demonstrating the occurrence of "shingling"

Next, as shown in FIG. 24, the controller controls the precision linear encoders to move the carrier 600 in the x and y direction so that the carrier is properly aligned to the pickup head 515 (and thus also aligned to the component held by the pickup head 515), based on the determined translational and angular offset between the carrier and the pickup head, and optionally, based on the thermal elongation of the carrier. After alignment, the pickup head 515 places the component on the carrier 600.

After placement of a component on the carrier 600, the second downward-looking camera 703 views the component on the carrier and the controller determines whether the component is in the correct position. If the component is misplaced, the pickup head 515 picks up that component, and the next pickup head 515 replaces it with another component. The misplaced component is cycled around the turret of the input/output device 502, and is re-aligned and placed on another carrier 600.

This process is then repeated for any additional components to be placed on the carrier 600. Because the carrier 600 is kitless (i.e., does not contain any apertures in which components are placed), any desired component patter on the carrier 600 can be generated.

Detecting Device Shingling

Shingling can occurs when components are misaligned on a carrier during placement, such that one component is inadvertently placed partially on top of another component. The pickup head 515 includes force and displacement sensors to detect z-axis force exerted on the pickup head, and to detect the z-displacement of the pickup head. The controller of the integrated testing and handler mechanism 500 is configured to receive information from the force and displacement sensors and retract the pickup head 515 immediately upon detection of shingling. The misplaced component is picked up again from the carrier 600 and replaced by the next component. The misplaced component will be cycled around the turret, re-aligned, and the placed onto the next carrier 600.

Docking and Undocking

The input/output module 502 is removably dockable to the test module 501 via rigid docking pins and a pneumatic self-clamping and centering mechanism, as shown in FIG. 26. To perform the docking procedure, the test module 501 is first moved so that the contactor area 508 is under the test head. The test module 501 is then leveled and aligned to the test head. The input/output module 502 is then moved towards the test module 501, and the height of the input/output module 502 is adjusted in accordance with the height of the test module 501. The input/output module 502 is then docked and locked to the test module 501 using the rigid docking pins and the pneumatic self-clamping and centering mechanism.

Operation of the Carrier Transfer Type Pick and Place System

The integrated testing and handler mechanism 500 of the fourth embodiment operates as follows. Components to be tested are loaded into the input section 511. The pickup heads 515 of the turret 520 pick up components at the input section 511. After vision alignment (as discussed in detail above), the pickup heads 515 transfer components to the carrier 600 while the carrier 600 is in the component loading location 513. The shuttle 507 moves the carrier 600 from the component loading location 513 into the gripper of the rotary table 503 at the test module transfer location 514. The rotary table 503 with the gripper transports the carrier 600 from the input/output module transfer location 505 to the plunger area. During the stepwise transportation of the carriers over the conductive soaking plate, they are heated up or cooled down to a set temperature. At the plunger area, the carrier is moved by the plunger out of the gripper.

The plunger plunges the component on the carrier 600 into the test sockets of the test head. After testing, the plunger then moves the carrier 600 back into the gripper of the rotary table 503. The rotary table 503 with the grippers 504 rotates the carrier 600 from the plunger transfer location 506 to the input/output module transfer location 505, while de-soaking them to a set temperature. The shuttle then moves the carrier 600 at the test module transfer location 514 out of the gripper to the component unloading/loading location 513. Finally, the pickup heads 515 of the turret 520 pick up tested component from the carrier 600 and transfer them to the output section 512.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

What is claimed is:

1. A component handling assembly comprising:
a carrier comprising a surface configured to support a plurality of components, the surface having a plurality of holes defined therein;
a vacuum generator configured to be arranged in communication with the plurality of holes such that a vacuum is applied, through the plurality of holes, to components supported on the surface of the carrier, to hold the components on the surface of the carrier; and
a vacuum sensor configured to monitor a level of the vacuum applied through the plurality of holes in the carrier to the components supported on the surface of the carrier.

2. The assembly of claim 1, further comprising a backup-vacuum system configured to maintain a vacuum applied to the components supported on the surface of the carrier if the vacuum applied by the vacuum generator is lost.

3. The assembly of claim 2, wherein the backup-vacuum is configured to activate when the vacuum sensor determines that the level of vacuum applied by the vacuum generator has dropped.

4. The assembly of claim 1, wherein the carrier comprises:
at least one vacuum interface; and
a main body including:
a lower body portion,
an upper body,
a central vacuum supply chamber located between the lower body portion and the upper body portion, and
a component placement layer disposed over the upper body portion, the component placement layer having the surface configured to support the components,
wherein a plurality of vacuum cavities extend through the upper body portion from the central vacuum supply chamber to the component placement layer.

5. The assembly of claim 4, wherein the component placement layer is made of a porous conductive material.

6. The assembly of claim 5, wherein the holes are microholes that extend through the component placement layer from each vacuum supply cavity to the surface of the component placement layer.

7. The assembly of claim 1, further comprising:
an input/output module including:
an input section,
an output section,
a plurality of component handling heads, the component handling heads being configured to (i) move components from the input section to the carrier, and (ii) move components from the carrier to the output section,
wherein the assembly is configured to maintain the vacuum supplied to the carrier while the components are loaded and unloaded at the input/output section.

8. The assembly of claim 7, further comprising:
a test module configured to test the component; and
a transport device configured to move the carrier from the input/output module to a test module;
wherein the assembly is further configured to maintain the vacuum supplied to the carrier while the carrier is moved from the input/output module to the test module, and while the carrier is at the test module.

9. The assembly of claim 7, wherein the assembly is configured to maintain the vacuum supplied to the carrier by alternately supplying vacuum to the carrier via multiple vacuum interfaces of the carrier.

10. A method comprising:
supporting a plurality of components on a surface of a carrier, the surface the surface having a plurality of holes defined therein;
applying a vacuum to the components supported on the surface of the carrier through the plurality of holes, to hold the components on the surface of the carrier; and
sensing a level of the vacuum applied through the plurality of holes in the carrier to the components supported on the surface of the carrier.

11. A carrier comprising:
a surface configured to support a plurality of components, the surface having a plurality of holes defined therein through which a vacuum can be applied to hold the components on the surface;
a first vacuum interface in communication with the plurality of holes, the first vacuum interface being connectable to a first vacuum generator such that the first vacuum generator can apply the vacuum to the components through the plurality of holes;
a second vacuum interface in communication with the plurality of holes, second first vacuum interface being connectable to a second vacuum generator such that the second vacuum generator can apply the vacuum to the components through the plurality of holes.

12. The carrier of claim 11, further comprising a central vacuum supply chamber located below the surface of the carrier, wherein the plurality of holes are in communication with the central vacuum chamber, and wherein the first and second vacuum interfaces are in communication with the central vacuum chamber.

13. The carrier of claim 11, comprising:
a main body including:
a lower body portion,
an upper body,
a central vacuum supply chamber located between the lower body portion and the upper body portion, and
a component placement layer disposed over the upper body portion, the component placement layer having the surface configured to support the components,
wherein a plurality of vacuum cavities extend through the upper body portion from the central vacuum supply chamber to the component placement layer.

14. The carrier of claim 11, wherein the component placement layer is made of a porous conductive material.

15. The carrier of claim 11, wherein the holes are microholes that extend through the component placement layer from each vacuum supply cavity to the surface of the component placement layer.

* * * * *